(12) United States Patent
Abe et al.

(10) Patent No.: US 10,340,070 B2
(45) Date of Patent: Jul. 2, 2019

(54) MULTILAYER COMMON MODE FILTER

(71) Applicant: TDK CORPORATION, Tokyo (JP)

(72) Inventors: Takuo Abe, Tokyo (JP); Makoto Yoshino, Tokyo (JP)

(73) Assignee: TDK CORPORATION, Tokyo (JP)

( * ) Notice: Subject to any disclaimer, the term of this patent is extended or adjusted under 35 U.S.C. 154(b) by 0 days.

(21) Appl. No.: 15/787,170

(22) Filed: Oct. 18, 2017

(65) Prior Publication Data

US 2018/0114624 A1    Apr. 26, 2018

(30) Foreign Application Priority Data

Oct. 24, 2016   (JP) ................................. 2016-207646

(51) Int. Cl.
| | | |
|---|---|---|
| H01F 17/00 | (2006.01) | |
| H03H 7/09 | (2006.01) | |
| H03H 7/42 | (2006.01) | |
| H03H 1/00 | (2006.01) | |

(52) U.S. Cl.
CPC .......... H01F 17/0013 (2013.01); H03H 7/09 (2013.01); H03H 7/427 (2013.01); *H01F 2017/0093* (2013.01); *H03H 2001/0078* (2013.01); *H03H 2001/0085* (2013.01)

(58) Field of Classification Search
CPC .. H03H 7/09; H03H 2001/0085; H03H 7/427; H03H 2001/0078; H01F 17/0013; H01F 2017/0093

USPC ................................................ 333/177, 185
See application file for complete search history.

(56) References Cited

U.S. PATENT DOCUMENTS

| | | |
|---|---|---|
| 2003/0052766 A1 | 3/2003 | Tomohiro et al. |
| 2016/0133374 A1 | 5/2016 | Inui |
| 2016/0372254 A1 | 12/2016 | Harada et al. |

FOREIGN PATENT DOCUMENTS

| | | |
|---|---|---|
| JP | 2003-124027 A | 4/2003 |
| JP | 3767437 B2 | 4/2006 |
| JP | 2016-157917 A | 9/2016 |
| KR | 10-2016-0055684 A | 5/2016 |

*Primary Examiner* — Rakesh B Patel
(74) *Attorney, Agent, or Firm* — Oliff PLC

(57) ABSTRACT

A multilayer common mode filter includes a first coil, a second coil and a third coil. The first coil includes a first coil conductor and a second coil conductor having spiral shapes and is configured by electrically connecting the first coil conductor and the second coil conductor. The second coil includes a third coil conductor and a fourth coil conductor having spiral shapes and is configured by electrically connecting the third coil conductor and the fourth coil conductor. The third coil includes a fifth coil conductor and a sixth coil conductor having spiral shapes and is configured by electrically connecting the fifth coil conductor and the sixth coil conductor. The first to sixth coil conductors are disposed in order of the first coil conductor, the third coil conductor, the fifth coil conductor, the second coil conductor, the fourth coil conductor, and the sixth coil conductor in a first direction.

5 Claims, 17 Drawing Sheets

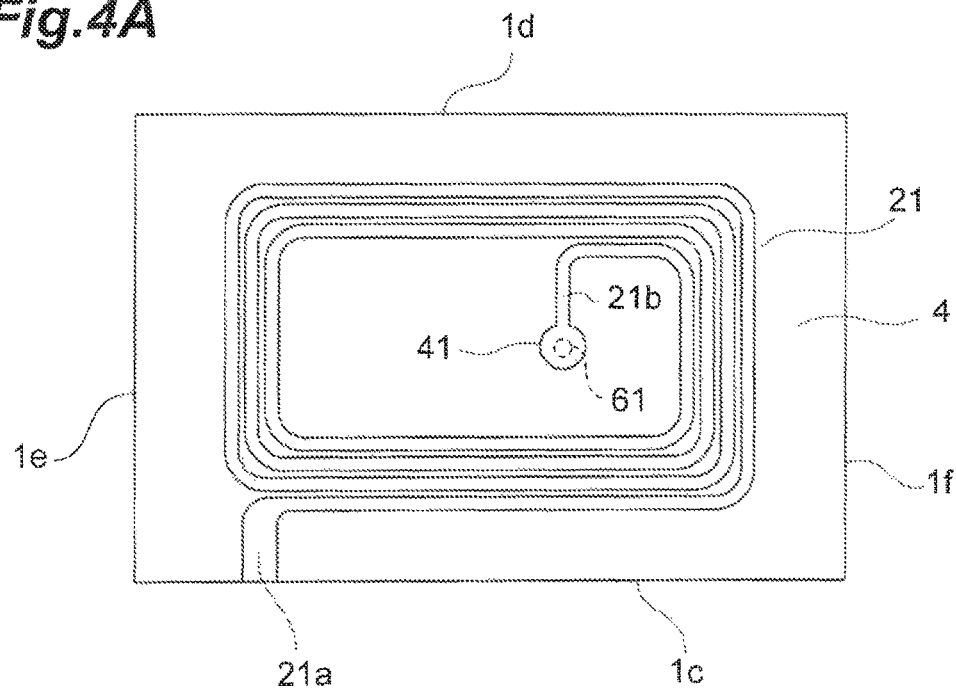
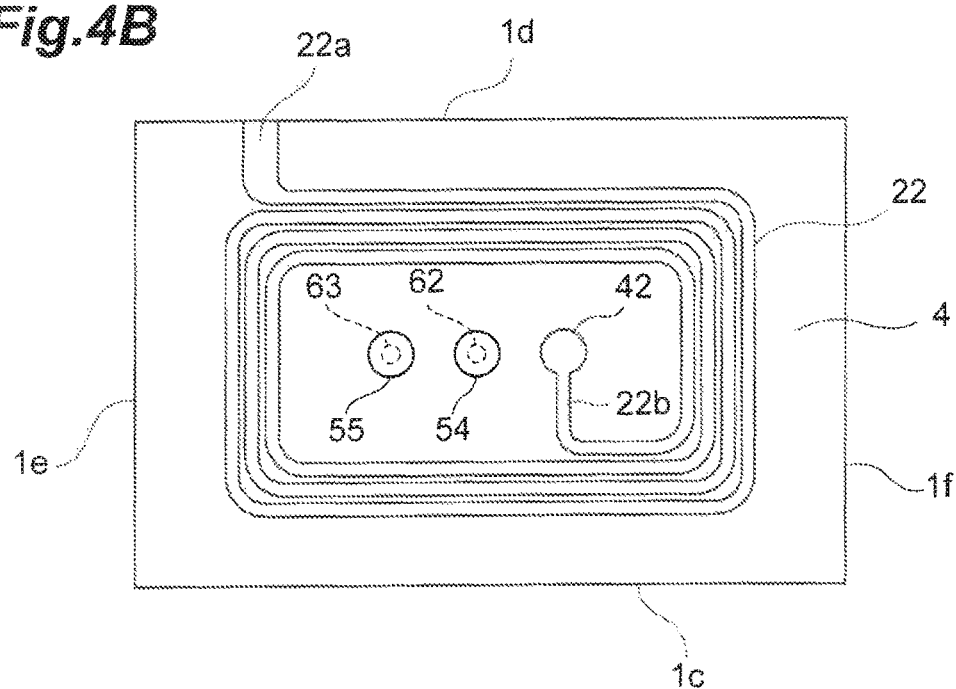

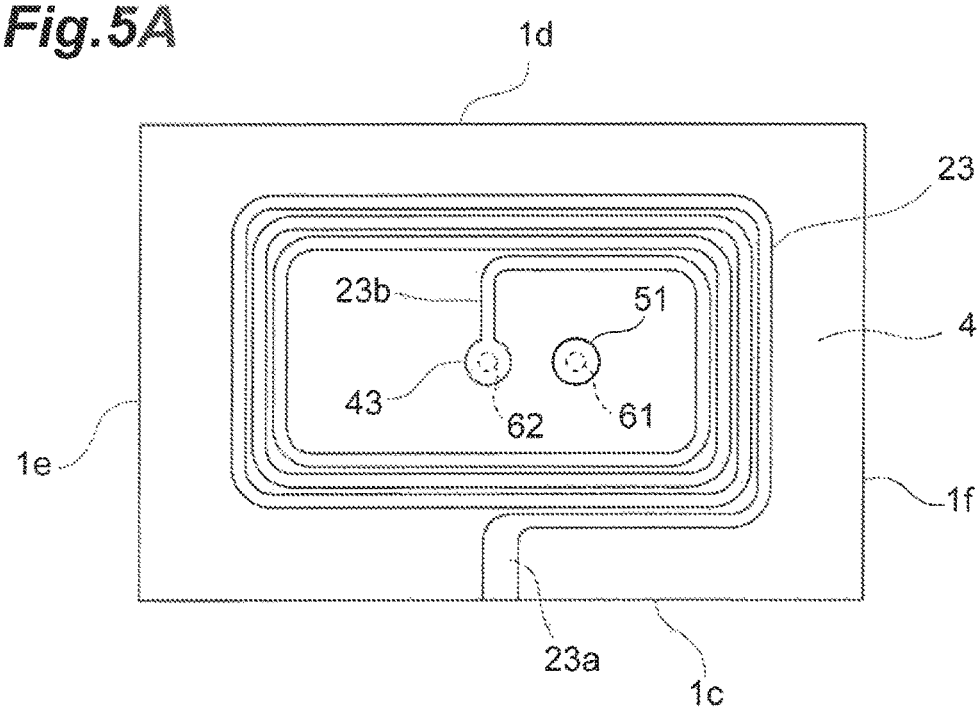
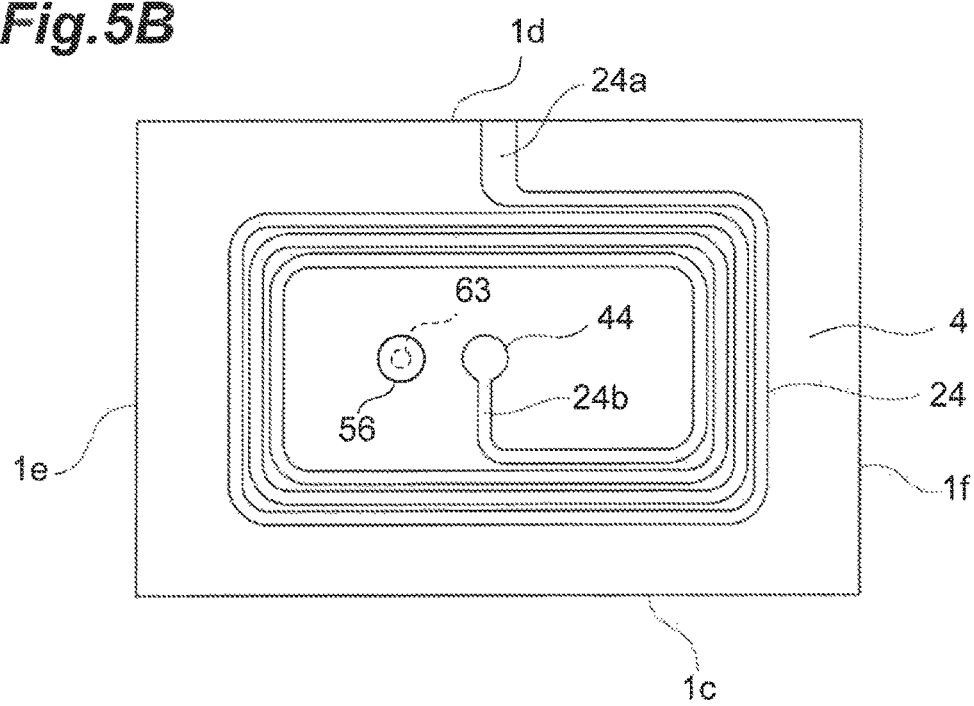

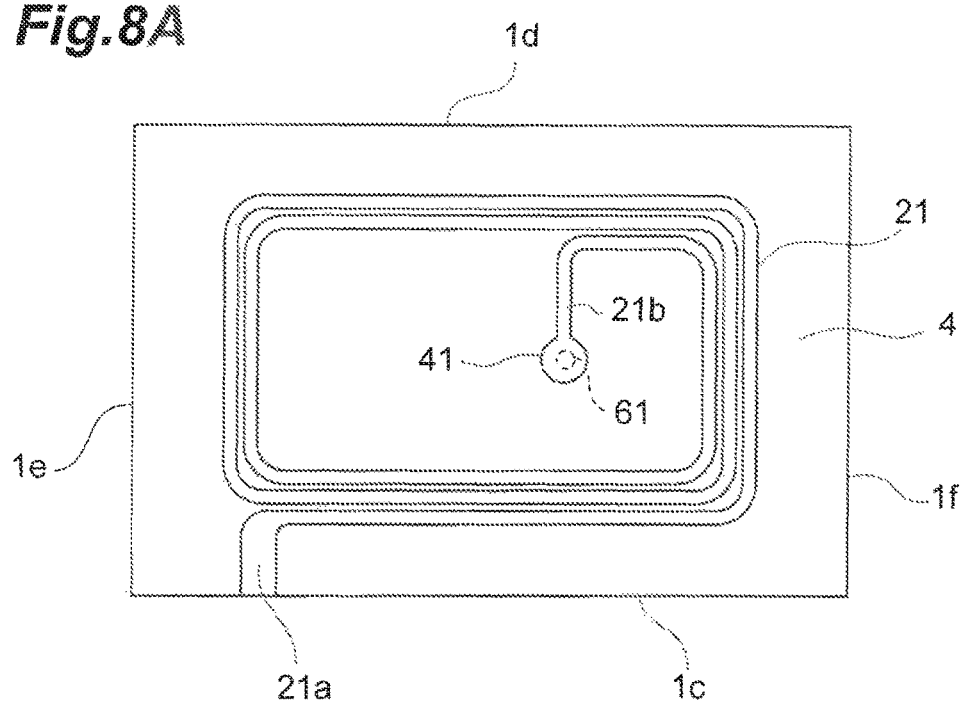
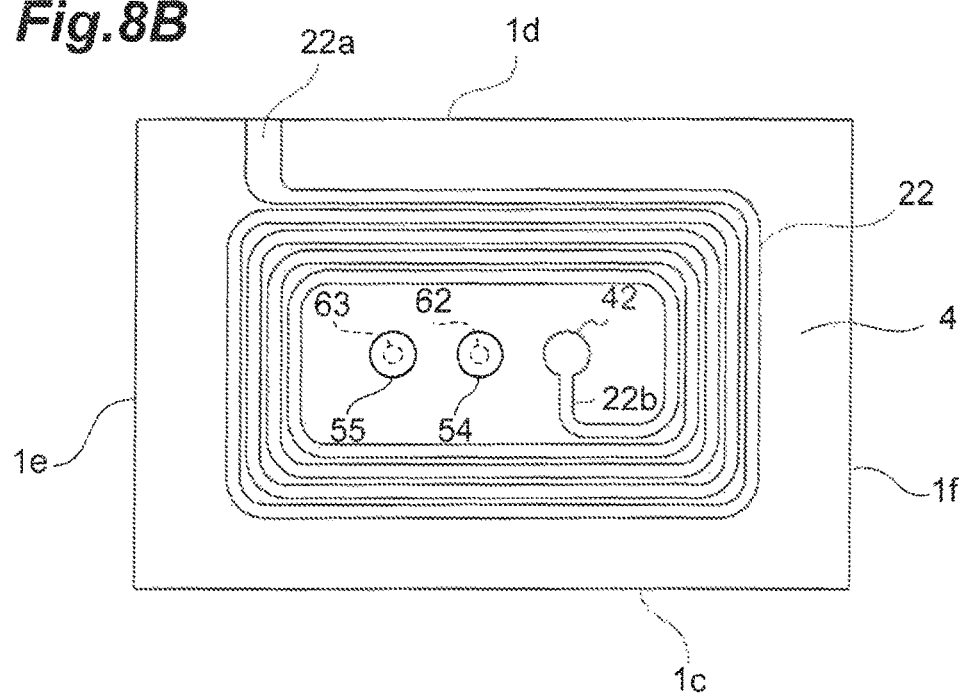

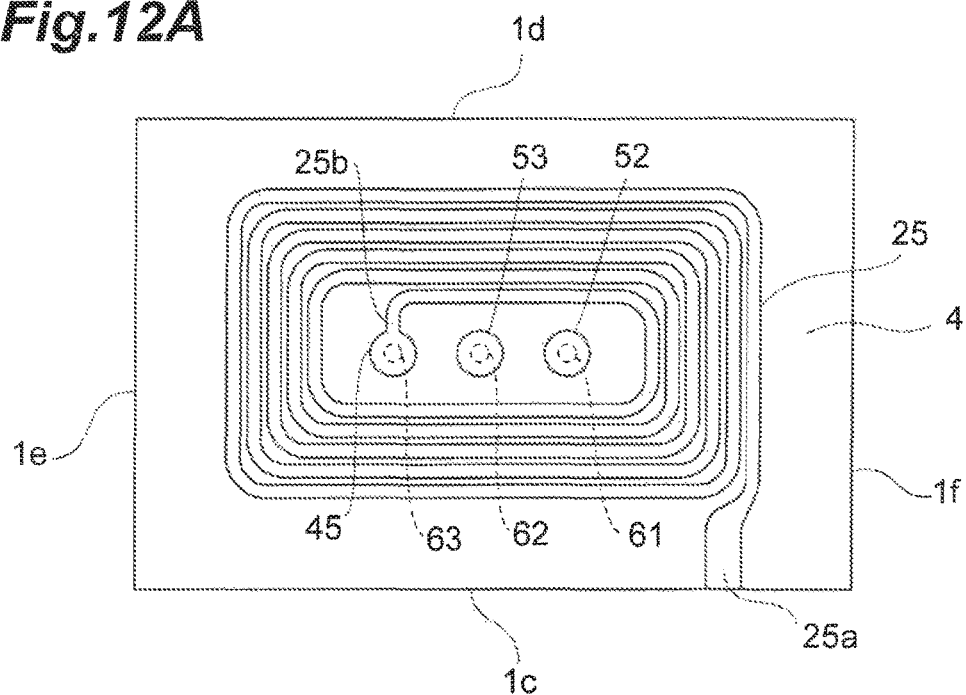
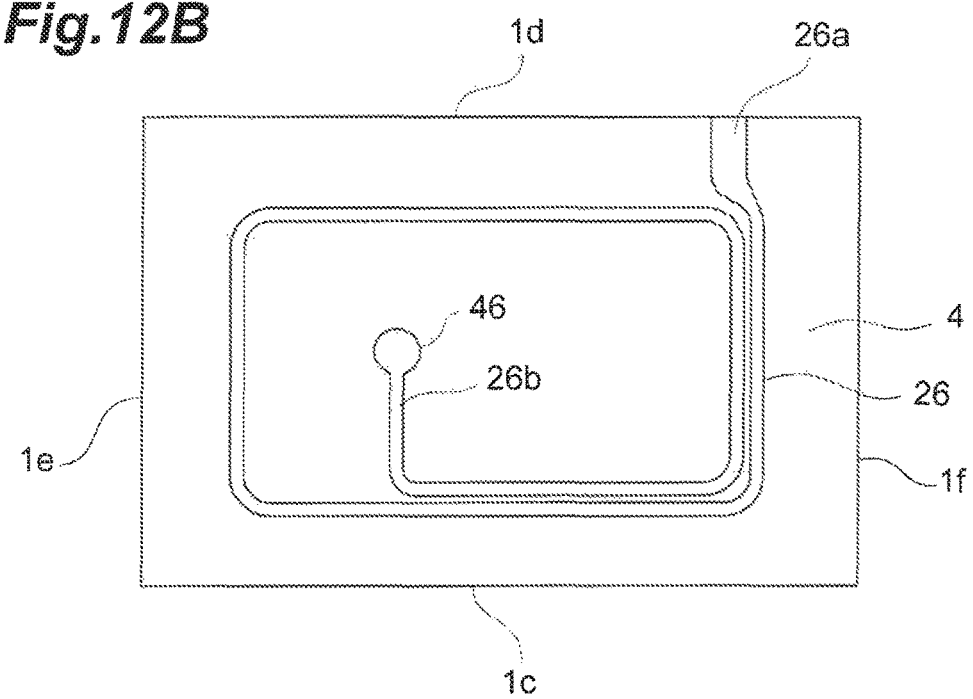

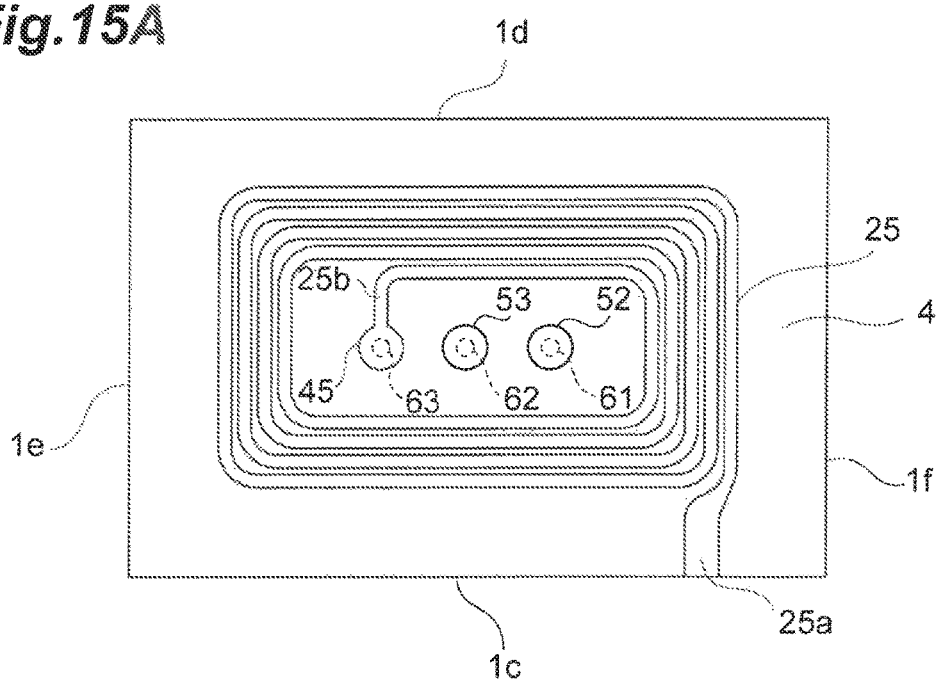
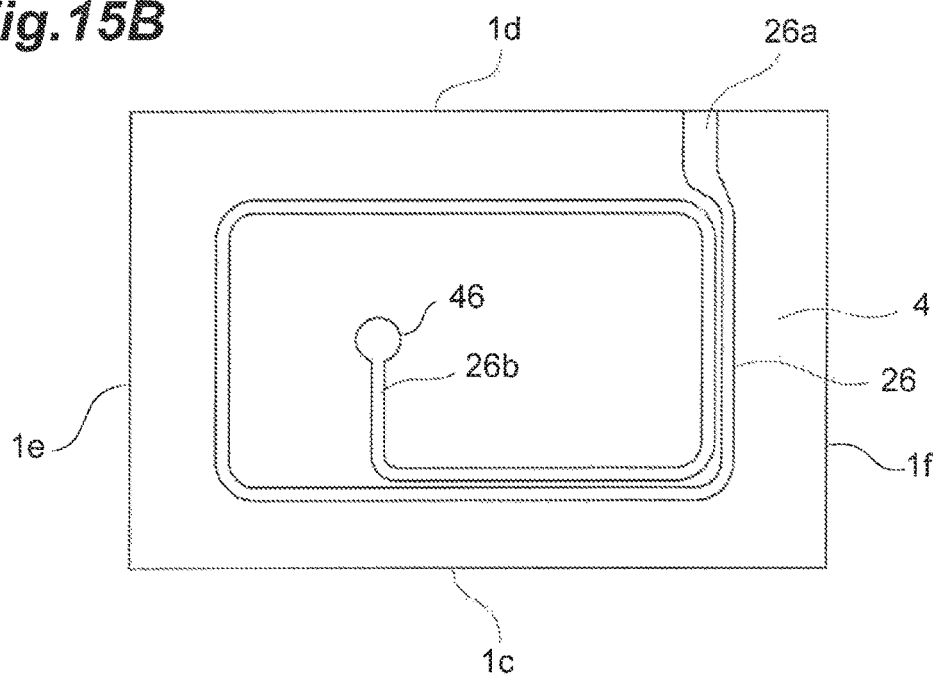

MULTILAYER COMMON MODE FILTER

BACKGROUND OF THE INVENTION

1. Field of the Invention

The present invention relates to a multilayer common mode filter.

2. Description of Related Art

Known multilayer common mode filters include an element body, a first coil, a second coil, and a third coil (for example, refer to Japanese Patent No. 3767437). The element body includes a pair of principal surfaces opposing each other in a first direction. The first coil, the second coil, and the third coil are disposed in the element body and are configured to be magnetically coupled to each other.

SUMMARY OF THE INVENTION

In the multilayer common mode filter described in Japanese Patent No. 3767437, the first to third coils are disposed in order of the first coil, the second coil, and the third coil in the first direction. Therefore, an interval between the first coil and the third coil is larger than an interval between the first coil and the second coil and is larger than an interval between the second coil and the third coil. That is, the intervals are different between the respective coils.

If the intervals are different between the respective coils, leakage inductance values (hereinafter, referred to as "leakage L values") are different between the respective coils. In the multilayer common mode filter, a leakage L value between the first coil and the third coil is different from a leakage L value between the first coil and the second coil and a leakage L value between the second coil and the third coil. Capacitance values are also different between the respective coils. In the multilayer common mode filter, a capacitance value between the first coil and the third coil is different from a capacitance value between the first coil and the second coil and a capacitance value between the second coil and the third coil.

A difference (hereinafter, simply referred to as a "leakage L value difference") between the leakage L value between the first coil and the second coil, the leakage L value between the second coil and the third coil, and the leakage L value between the first coil and the third coil and a difference (hereinafter, simply referred to as a "capacitance value difference") between the capacitance value between the first coil and the second coil, the capacitance value between the second coil and the third coil, and the capacitance value between the first coil and the third coil are caused by an imbalance in the intervals between the respective coils. If the imbalance of the interval between the first coil and the second coil, the interval between the second coil and the third coil, and the interval between the first coil and the third coil is large, a difference (hereinafter, simply referred to as a "characteristic impedance difference) between a characteristic impedance in the first coil and the second coil, a characteristic impedance in the second coil and the third coil, and a characteristic impedance in the first coil and the third coil is large. If the characteristic impedance difference is large, this may adversely affect a signal quality, for example.

The characteristic impedance in the first coil and the second coil is represented by (the leakage L value between the first coil and the second coil/the capacitance value between the first coil and the second coil)$^{1/2}$. The characteristic impedance in the second coil and the third coil is represented by (the leakage L value between the second coil and the third coil/the capacitance value between the second coil and the third coil)$^{1/2}$. The characteristic impedance in the first coil and the third coil is represented by (the leakage L value between the first coil and the third coil/the capacitance value between the first coil and the third coil)$^{1/2}$.

An object of one aspect of the present invention is to provide a multilayer common mode filter in which a characteristic impedance difference is small.

A multilayer common mode filter according to one aspect of the present invention includes an element body, a first coil, a second coil, and a third coil. The element body includes a pair of principal surfaces opposing each other in a first direction. The first coil, the second coil, and the third coil are disposed in the element body and are configured to be magnetically coupled to each other. The first coil includes a first coil conductor and a second coil conductor having spiral shapes. The first coil is configured by electrically connecting the first coil conductor and the second coil conductor. The second coil includes a third coil conductor and a fourth coil conductor having spiral shapes. The second coil is configured by electrically connecting the third coil conductor and the fourth coil conductor. The third coil includes a fifth coil conductor and a sixth coil conductor having spiral shapes. The third coil is configured by electrically connecting the fifth coil conductor and the sixth coil conductor. The first to sixth coil conductors are disposed in order of the first coil conductor, the third coil conductor, the fifth coil conductor, the second coil conductor, the fourth coil conductor, and the sixth coil conductor in the first direction.

In the multilayer common mode filter according to the one aspect, an imbalance of an interval between the first coil and the second coil, an interval between the second coil and the third coil, and an interval between the first coil and the third coil is small. Therefore, a characteristic impedance difference is small.

In the one aspect, the number of windings of the first coil conductor and the number of windings of the sixth coil conductor may be smaller than both the number of windings of the fifth coil conductor and the number of windings of the second coil conductor. In which case, the characteristic impedance difference is smaller.

In the one aspect, a total value of the number of windings of the first coil conductor and the number of windings of the second coil conductor may be smaller than a total value of the number of windings of the third coil conductor and the number of windings of the fourth coil conductor and a total value of the number of windings of the fifth coil conductor and the number of windings of the sixth coil conductor may be smaller than the total value of the number of windings of the third coil conductor and the number of windings of the fourth coil conductor. In which case, an inductance value of each of the first coil and the third coil is smaller than an inductance value of the second coil. Therefore, a leakage L value between the first coil and the third coil is small and the characteristic impedance difference is smaller.

In the one aspect, outer diameters of the third coil conductor and the fourth coil conductor may be smaller than outer diameters of the first coil conductor, the second coil conductor, the fifth coil conductor, and the sixth coil conductor. In this embodiment, inner diameters of the third coil conductor and the fourth coil conductor can be decreased, as compared with a configuration in which the outer diameters of the third coil conductor and the fourth coil conductor are equivalent to the outer diameters of the first coil conductor, the second coil conductor, the fifth coil conductor, and the sixth coil conductor. In which case, a difference between the inductance value of each of the first coil and the third coil and the inductance value of the second coil can be decreased.

The present invention will become more fully understood from the detailed description given hereinafter and the accompanying drawings which are given by way of illustration only, and thus are not to be considered as limiting the present invention.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

FIG. 4A is a plan view illustrating a first coil conductor;

FIG. 4B is a plan view illustrating a second coil conductor;

FIG. 5A is a plan view illustrating a third coil conductor;

FIG. 5B is a plan view illustrating a fourth coil conductor;

FIG. 8A is a plan view illustrating a first coil conductor;

FIG. 8B is a plan view illustrating a second coil conductor;

FIG. 12A is a plan view illustrating a fifth coil conductor;

FIG. 12B is a plan view illustrating a sixth coil conductor;

FIG. 15A is a plan view illustrating a fifth coil conductor;

FIG. 15B is a plan view illustrating a sixth coil conductor;

DETAILED DESCRIPTION OF EMBODIMENTS

Figure 1:
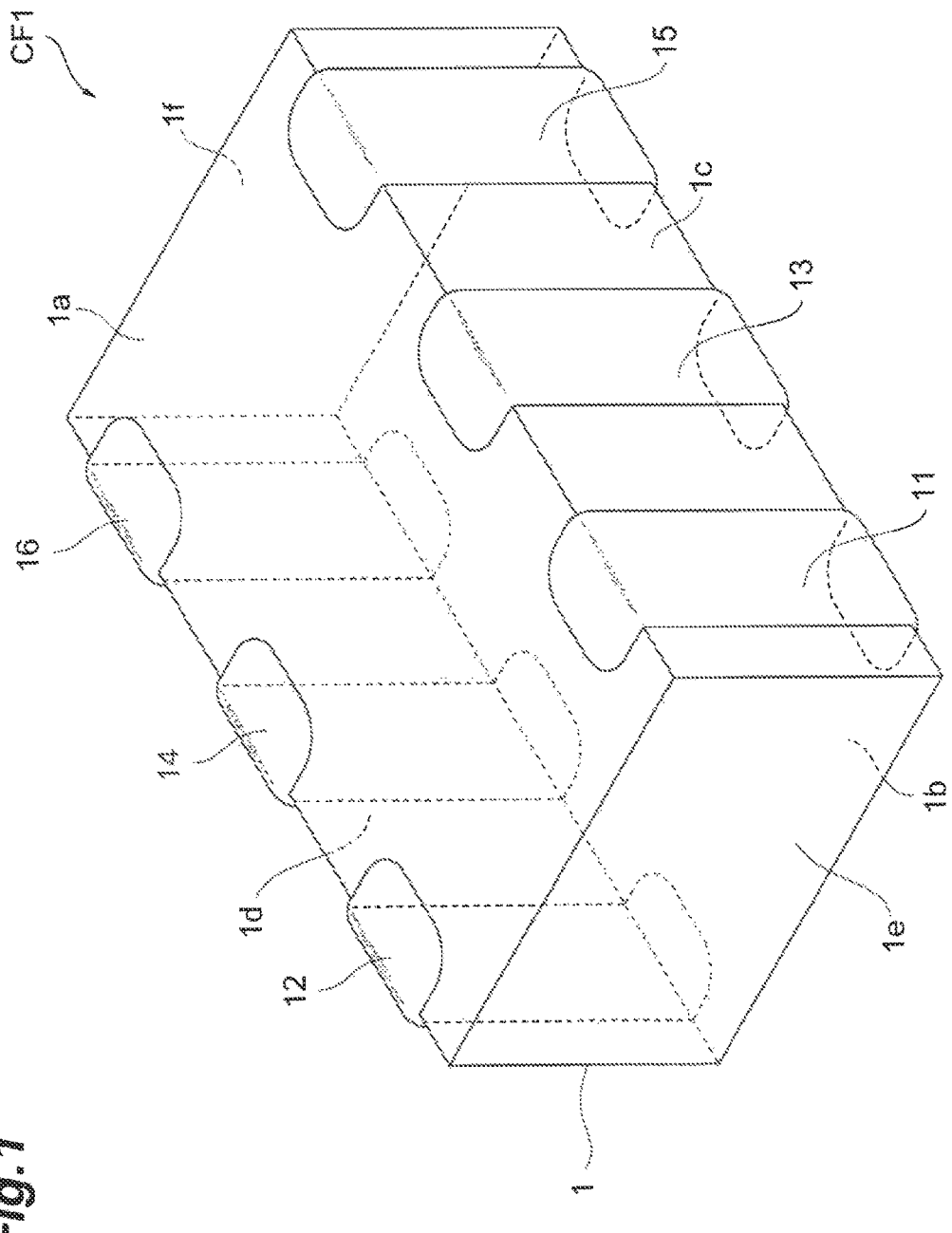
FIG. 1 is a perspective view illustrating a multilayer common mode filter according to an embodiment.

Hereinafter, embodiments of the present invention will be described in detail with reference to the accompanying drawings. In the following description, the same elements or elements having the same functions are denoted with the same reference numerals and overlapped explanation is omitted.

Figure 2:
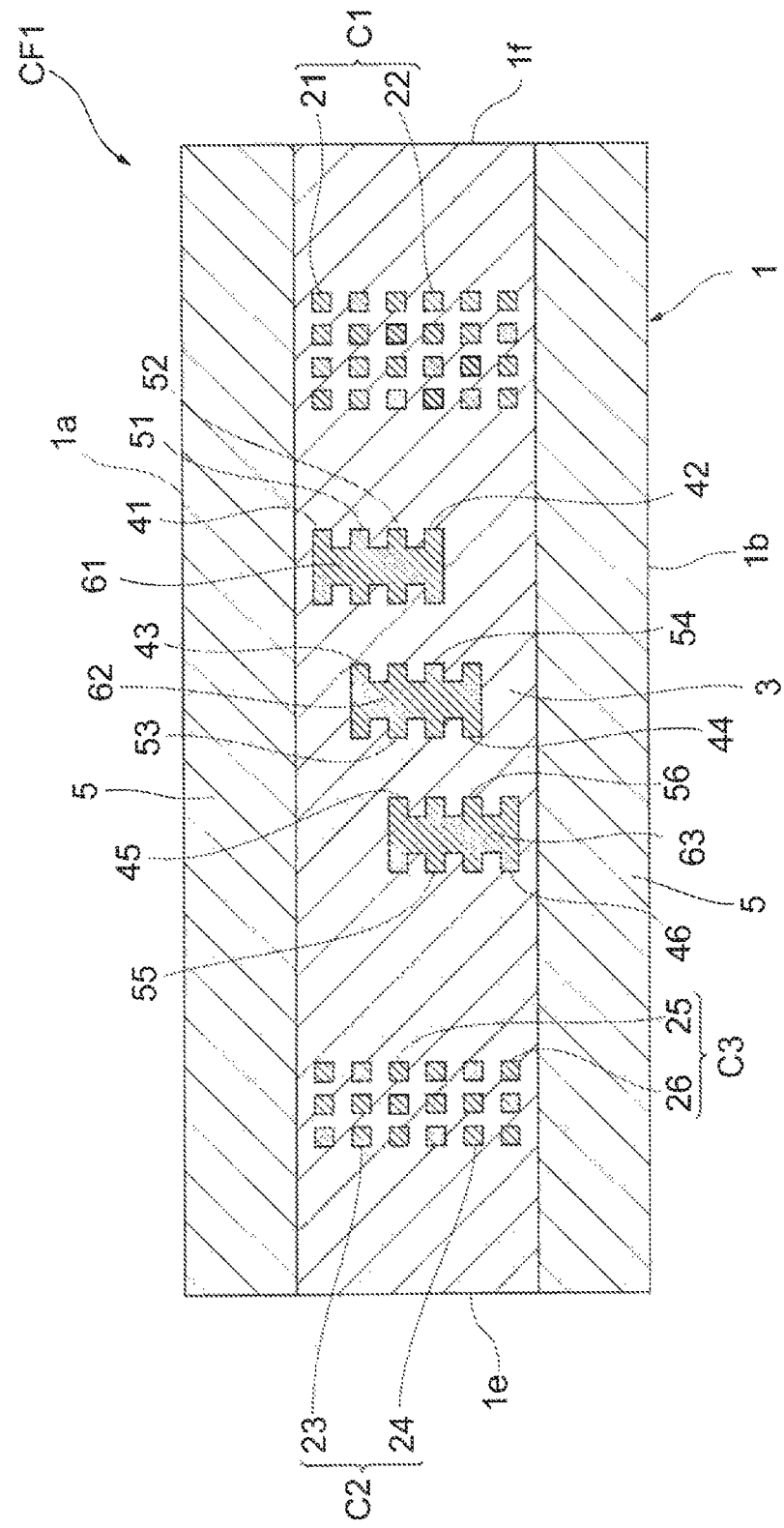
FIG. 2 is a diagram illustrating a cross-sectional configuration of an element body.
Figure 3:
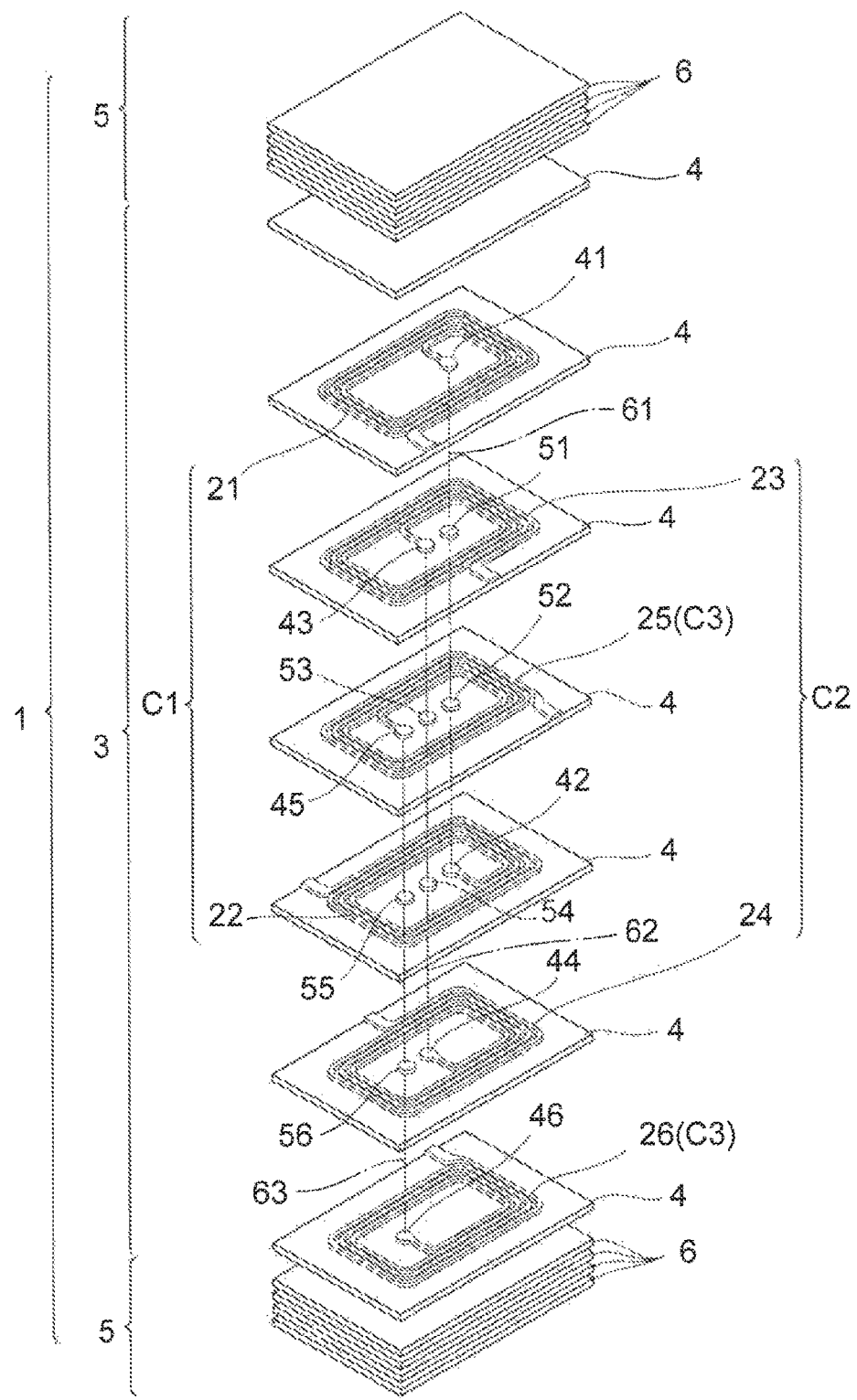
FIG. 3 is an exploded perspective view illustrating a configuration of the element body.

Referring to FIGS. 1, 2 and 3, a configuration of a multilayer common mode filter CF1 according to an embodiment will be described. FIG. 1 is a perspective view illustrating the multilayer common mode filter according to the embodiment. FIG. 2 is a diagram illustrating a cross-sectional configuration of an element body. FIG. 3 is an exploded perspective view illustrating a configuration of the element body.

As illustrated in FIG. 1, the multilayer common mode filter CF1 includes an element body 1, a first terminal electrode 11, a second terminal electrode 12, a third terminal electrode 13, a fourth terminal electrode 14, a fifth terminal electrode 15, and a sixth terminal electrode 16. The first terminal electrode 11, the second terminal electrode 12, the third terminal electrode 13, the fourth terminal electrode 14, the fifth terminal electrode 15, and the sixth terminal electrode 16 are disposed on an external surface of the element body 1. The multilayer common mode filter CF1 is mounted on an electronic device (for example, a circuit board or an electronic component) in such a manner that each of the first terminal electrode 11, the second terminal electrode 12, the third terminal electrode 13, the fourth terminal electrode 14, the fifth terminal electrode 15, and the sixth terminal electrode 16 is connected to a signal line.

The element body 1 has a rectangular parallelepiped shape. The element body 1 includes a first principal surface 1a, a second principal surface 1b, a first side surface 1c, a second side surface 1d, a third side surface 1e, and a fourth side surface 1f. The first principal surface 1a and the second principal surface 1b oppose each other and have a rectangular shape. The first side surface 1c and the second side surface 1d oppose each other. The third side surface 1e and the fourth side surface if oppose each other. A longitudinal direction of the element body 1 is a direction in which the third side surface 1e and the fourth side surface 1f oppose each other. A width direction of the element body 1 is a direction in which the first side surface 1c and the second side surface 1d oppose each other. A height direction of the element body 1 is a direction in which the first principal surface 1a and the second principal surface 1b oppose each other. The first principal surface 1a and the second principal surface 1b oppose each other in the height direction of the element body 1. The rectangular parallelepiped shape includes a shape of a rectangular parallelepiped in which a corner portion and a ridge portion are chamfered and a shape of a rectangular parallelepiped in which a corner portion and a ridge portion are rounded.

The first and second side surfaces 1c and 1d extend in the height direction of the element body 1 to connect the first principal surface 1a and the second principal surface 1b. The first and second side surfaces 1c and 1d extend in the longitudinal direction (long-side direction of the first and second principal surfaces 1a and 1b) of the element body 1. The third and fourth side surfaces 1e and 1f extend in the height direction of the element body 1 to connect the first principal surface 1a and the second principal surface 1b. The third and fourth side surfaces 1e and 1f extend in the width direction (short-side direction of the first and second principal surfaces 1a and 1b) of the element body 1.

As illustrated in FIG. 2, the element body 1 includes a non-magnetic portion 3 and a pair of magnetic portions 5. The pair of magnetic portions 5 is disposed to sandwich the non-magnetic portion 3 therebetween in the height direction of the element body 1. The element body 1 is configured by a plurality of laminated insulator layers. The element body 1 includes the plurality of insulator layers. In the non-magnetic portion 3, a plurality of non-magnetic layers 4 are laminated as the insulator layers. The non-magnetic portion 3 is configured by the plurality of laminated non-magnetic layers 4. The non-magnetic portion 3 includes the plurality of non-magnetic layers 4. In each magnetic portion 5, a plurality of magnetic layers 6 are laminated as the insulator layers. The magnetic portion 5 is configured by the plurality of laminated magnetic layers 6. Each of the magnetic portions 5 includes the plurality of magnetic layers 6. The plurality of insulator layers include the plurality of non-magnetic layers 4 and the plurality of magnetic layers 6.

Each non-magnetic layer 4 is configured by a sintered body of a ceramic green sheet including a non-magnetic material (a Cu—Zn based ferrite material, a dielectric material, or a glass ceramic material), for example. Each magnetic layer 6 is configured by a sintered body of a ceramic green sheet including a magnetic material (a Ni—Cu—Zn based ferrite material, a Ni—Cu—Zn—Mg based ferrite material, or a Ni—Cu based ferrite material), for example.

In the actual element body 1, the non-magnetic layers 4 and the magnetic layers 6 are integrated in such a manner that inter-layer boundaries cannot be visualized. The height direction (direction in which the first principal surface 1a and the second principal surface 1b oppose each other) of the element body 1 is matched with a direction in which the plurality of insulator layers (the plurality of non-magnetic layers 4 and the plurality of magnetic layers 6) are laminated. Hereinafter, the direction in which the plurality of insulator layers are laminated is simply referred to as a "lamination direction".

The first terminal electrode 11, the third terminal electrode 13, and the fifth terminal electrode 15 are disposed on the first side surface 1c of the element body 1. The first terminal electrode 11, the third terminal electrode 13, and the fifth terminal electrode 15 are formed in such a manner that a part of the first side surface 1c is covered along the height direction of the element body 1 and are formed on a part of the first principal surface 1a and a part of the second principal surface 1b. The first terminal electrode 11 is located closer to the third side surface 1e and the fifth terminal electrode 15 is located closer to the fourth side surface 1f. The third terminal electrode 13 is located between the first terminal electrode 11 and the fifth terminal electrode 15.

The second terminal electrode 12, the fourth terminal electrode 14, and the sixth terminal electrode 16 are disposed on the second side surface 1d of the element body 1. The second terminal electrode 1 the fourth terminal electrode 14, and the sixth terminal electrode 16 are formed in such a manner that a part of the second side surface 1d is covered along the height direction of the element body 1 and are formed on a part of the first principal surface 1a and a part of the second principal surface 1b. The second terminal electrode 12 is located closer to the third side surface 1e and the sixth terminal electrode 16 is located closer to the fourth side surface 1f. The fourth terminal electrode 14 is located between the second terminal electrode 12 and the sixth terminal electrode 16.

Each of the first to sixth terminal electrodes 11 to 16 includes a conductive material (for example, Ag or Pd). Each of the first to sixth terminal electrodes 11 to 16 is configured as a sintered body of conductive paste including a conductive material (for example, Ag powder or Pd powder). A plating layer is formed on a surface of each of the first to sixth terminal electrodes 11 to 16. The plating layer is formed by electroplating, for example. The plating layer has a layer structure including a Cu plating layer, a Ni plating layer, and a Sn plating layer or a layer structure including a Ni plating layer and a Sn plating layer, for example.

The multilayer common mode filter CF1 includes a first coil conductor 21, a second coil conductor 22, a third coil conductor 23, a fourth coil conductor 24, a fifth coil conductor 25, and a sixth coil conductor 26 in the non-magnetic portion 3, as illustrated in FIGS. 2 and 3. Each of the first to sixth coil conductors 21 to 26 includes a conductive material (for example, Ag or Pd). Each of the first to sixth coil conductors 21 to 26 is configured as a sintered body of conductive paste including a conductive material (for example, Ag powder or Pd powder).

The first coil conductor 21 has a spiral shape as illustrated in FIG. 4A and is disposed between the pair of non-magnetic layers 4 adjacent to each other in the lamination direction. One end (outer end) 21a of the first coil conductor 21 is exposed at the first side surface 1c. The first coil conductor 21 is connected to the first terminal electrode 11 at the end exposed at the first side surface 1c. The one end 21a of the first coil conductor 21 functions as a connection conductor with the first terminal electrode 11. Another end (inner end) 21b of the first coil conductor 21 is connected to a pad conductor 41 located at the same layer as the first coil conductor 21. In the embodiment, the first coil conductor 21 and the pad conductor 41 are integrally formed.

The second coil conductor 22 has a spiral shape as illustrated in FIG. 4B and is disposed between the pair of non-magnetic layers 4 adjacent to each other in the lamination direction. One end (outer end) 22a of the second coil conductor 22 is exposed at the second side surface 1d. The second coil conductor 22 is connected to the second terminal electrode 12 at the end exposed at the second side surface 1d. The one end 22a of the second coil conductor 22 functions as a connection conductor with the second terminal electrode 12. Another end (inner end) 22b of the second coil conductor 22 is connected to a pad conductor 42 located at the same layer as the second coil conductor 22. In the embodiment, the second coil conductor 22 and the pad conductor 42 are integrally formed.

The third coil conductor 23 has a spiral shape as illustrated in FIG. 5A and is disposed between the pair of non-magnetic layers 4 adjacent to each other in the lamination direction. One end (outer end) 23a of the third coil conductor 23 is exposed at the first side surface 1c. The third coil conductor 23 is connected to the third terminal electrode 13 at the end exposed at the first side surface 1c. The one end 23a of the third coil conductor 23 functions as a connection conductor with the third terminal electrode 13. Another end (inner end) 23b of the third coil conductor 23 is connected to a pad conductor 43 located at the same layer as the third coil conductor 23. In the embodiment, the third coil conductor 23 and the pad conductor 43 are integrally formed.

The fourth coil conductor 24 has a spiral shape as illustrated in FIG. 5B and is disposed between the pair of non-magnetic layers 4 adjacent to each other in the lamination direction. One end (outer end) 24a of the fourth coil conductor 24 is exposed at the second side surface 1d. The fourth coil conductor 24 is connected to the fourth terminal electrode 14 at the end exposed at the second side surface 1d. The one end 24a of the fourth coil conductor 24 functions as a connection conductor with the fourth terminal electrode 14. Another end (inner end) 24b of the fourth coil conductor 24 is connected to a pad conductor 44 located at the same layer as the fourth coil conductor 24. In the embodiment, the fourth coil conductor 24 and the pad conductor 44 are integrally formed.

Figure 6A:
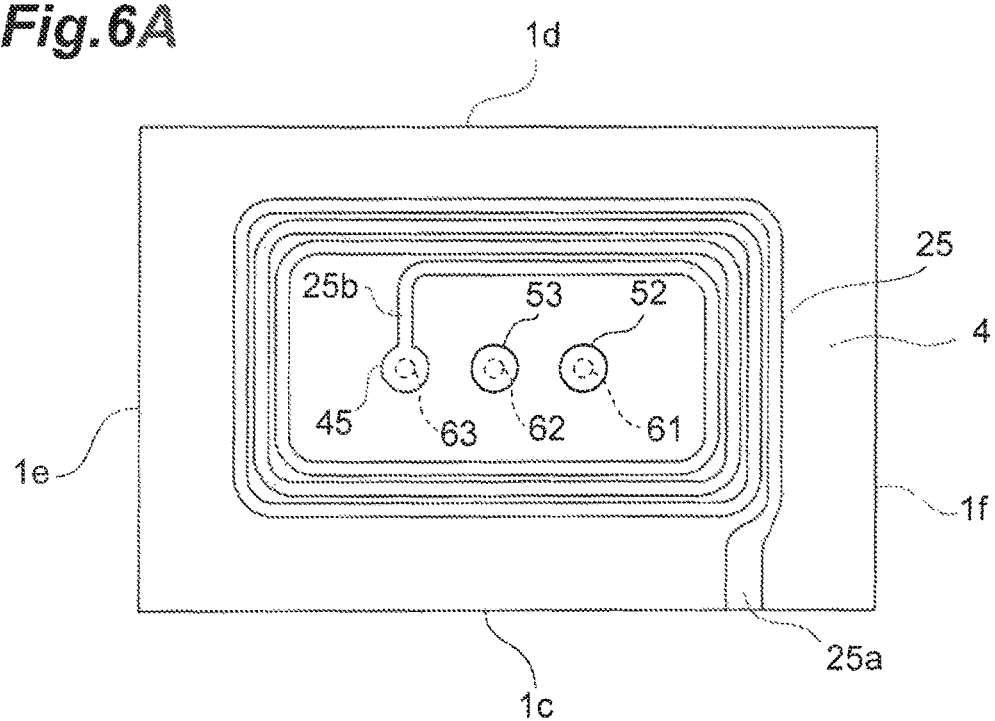
FIG. 6A is a plan view illustrating a fifth coil conductor.

The fifth coil conductor 25 has a spiral shape as illustrated in FIG. 6A and is disposed between the pair of non-magnetic layers 4 adjacent to each other in the lamination direction. One end (outer end) 25a of the fifth coil conductor 25 is exposed at the first side surface 1c. The fifth coil conductor 25 is connected to the fifth terminal electrode 15 at the end exposed at the first side surface 1c. The one end 25a of the fifth coil conductor 25 functions as a connection conductor with the fifth terminal electrode 15. Another end (inner end) 25b of the fifth coil conductor 25 is connected to a pad conductor 45 located at the same layer as the fifth coil conductor 25. In the embodiment, the fifth coil conductor 25 and the pad conductor 45 are integrally formed.

Figure 6B:
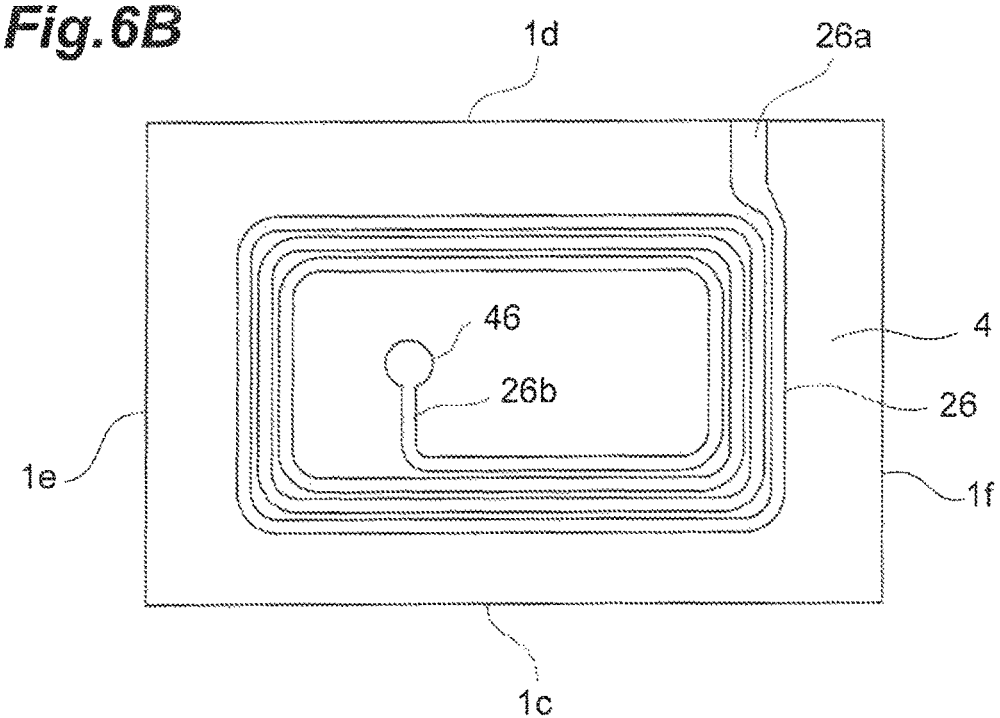
FIG. 6B is a plan view illustrating a sixth coil conductor.

The sixth coil conductor 26 has a spiral shape as illustrated in FIG. 6B and is disposed between the pair of non-magnetic layers 4 adjacent to each other in the lamination direction. One end (outer end) 26a of the sixth coil conductor 26 is exposed to the second side surface 1d. The sixth coil conductor 26 is connected at the sixth terminal electrode 16 at the end exposed at the second side surface 1d. The one end 26a of the sixth coil conductor 26 functions as a connection conductor with the sixth terminal electrode 16. Another end (inner end) 26b of the sixth coil conductor 26 is connected to a pad conductor 46 located at the same layer as the sixth coil conductor 26. In the embodiment, the sixth coil conductor 26 and the pad conductor 46 are integrally formed.

The first to sixth coil conductors 21 to 26 are disposed in order of the first coil conductor 21, the third coil conductor 23, the fifth coil conductor 25, the second coil conductor 22, the fourth coil conductor 24, and the sixth coil conductor 26 in the height direction of the element body 1. The first to sixth coil conductors 21 to 26 are wound in the same direction and are located to overlap each other, when viewed from the lamination direction.

The first coil conductor 21 and the third coil conductor 23 are adjacent to each other with the non-magnetic layer 4 therebetween in the lamination direction. The third coil conductor 23 and the fifth coil conductor 25 are adjacent to each other with the non-magnetic layer 4 therebetween in the lamination direction. The fifth coil conductor 25 and the second coil conductor 22 are adjacent to each other with the non-magnetic layer 4 therebetween in the lamination direction. The second coil conductor 22 and the fourth coil conductor 24 are adjacent to each other with the non-magnetic layer 4 therebetween in the lamination direction. The fourth coil conductor 24 and the sixth coil conductor 26 are adjacent to each other with the non-magnetic layer 4 therebetween in the lamination direction.

The third coil conductor 23 is located between the first coil conductor 21 and the fifth coil conductor 25 in the lamination direction. The fifth coil conductor 25 is located between the third coil conductor 23 and the second coil conductor 22 in the lamination direction. The second coil conductor 22 is located between the fifth coil conductor 25 and the fourth coil conductor 24 in the lamination direction. The fourth coil conductor 24 is located between the second coil conductor 22 and the sixth coil conductor 26 in the lamination direction.

The pad conductor 41 and the pad conductor 42 are located to overlap each other, when viewed from the lamination direction. Between the pad conductor 41 and the pad conductor 42, two pad conductors 51 and 52 are disposed to overlap the pad conductors 41 and 42, when viewed from the lamination direction. The pad conductor 51 is located at the same layer as the third coil conductor 23. The pad conductor 52 is located at the same layer as the fifth coil conductor 25. The pad conductor 41 and the pad conductor 51 are adjacent to each other with the non-magnetic layer 4 therebetween in the lamination direction. The pad conductor 51 and the pad conductor 52 are adjacent to each other with the non-magnetic layer 4 therebetween in the lamination direction. The pad conductor 52 and the pad conductor 42 are adjacent to each other with the non-magnetic layer 4 therebetween in the lamination direction.

The pad conductors 41, 51, 52, and 42 are connected via a through-hole conductor 61. The through-hole conductor 61 penetrates the non-magnetic layer 4 located between the pad conductor 41 and the pad conductor 51, the non-magnetic layer 4 located between the pad conductor 51 and the pad conductor 52, and the non-magnetic layer 4 located between the pad conductor 52 and the pad conductor 42.

The pad conductor 43 and the pad conductor 44 are located to overlap each other, when viewed from the lamination direction. Between the pad conductor 43 and the pad conductor 44, two pad conductors 53 and 54 are disposed to overlap the pad conductors 43 and 44, when viewed from the lamination direction. The pad conductor 53 is located at the same layer as the fifth coil conductor 25. The pad conductor 54 is located at the same layer as the second coil conductor 22. The pad conductor 43 and the pad conductor 53 are adjacent to each other with the non-magnetic layer 4 therebetween in the lamination direction. The pad conductor 53 and the pad conductor 54 are adjacent to each other with the non-magnetic layer 4 therebetween in the lamination direction. The pad conductor 54 and the pad conductor 44 are adjacent to each other with the non-magnetic layer 4 therebetween in the lamination direction.

The pad conductors 43, 54, and 44 are connected via a through-hole conductor 62. The through-hole conductor 62 penetrates the non-magnetic layer 4 located between the pad conductor 43 and the pad conductor 53, the non-magnetic layer 4 located between the pad conductor 53 and the pad conductor 54, and the non-magnetic layer 4 located between the pad conductor 54 and the pad conductor 44.

The pad conductor 45 and the pad conductor 46 are located to overlap each other, when viewed from the lamination direction. Between the pad conductor 45 and the pad conductor 46, two pad conductors 55 and 56 are disposed to overlap the pad conductors 45 and 46, when viewed from the lamination direction. The pad conductor 55 is located at the same layer as the second coil conductor 22. The pad conductor 56 is located at the same layer as the fourth coil conductor 24. The pad conductor 45 and the pad conductor 55 are adjacent to each other with the non-magnetic layer 4 therebetween in the lamination direction. The pad conductor 55 and the pad conductor 56 are adjacent to each other with the non-magnetic layer 4 therebetween in the lamination direction. The pad conductor 56 and the pad conductor 46 are adjacent to each other with the non-magnetic layer 4 therebetween in the lamination direction.

The pad conductors 45, 55, 56, and 46 are connected via a through-hole conductor 63. The through-hole conductor 63 penetrates the non-magnetic layer 4 located between the pad conductor 45 and the pad conductor 55, the non-magnetic layer 4 located between the pad conductor 55 and the pad conductor 56, and the non-magnetic layer 4 located between the pad conductor 56 and the pad conductor 46.

The first coil conductor 21 and the second coil conductor 22 are electrically connected via the pad conductor 41, the pad conductor 51, the pad conductor 52, the pad conductor 42, and the through-hole conductor 61. The first coil conductor 21 and the second coil conductor 22 configure a first coil C1. The first coil C1 includes the first coil conductor 21 and the second coil conductor 22.

The third coil conductor 23 and the fourth coil conductor 24 are electrically connected via the pad conductor 43, the pad conductor 53, the pad conductor 54, the pad conductor 44, and the through-hole conductor 62. The third coil conductor 23 and the fourth coil conductor 24 configure a second coil C2. The second coil C2 includes the third coil conductor 23 and the fourth coil conductor 24.

The fifth coil conductor 25 and the sixth coil conductor 26 are electrically connected via the pad conductor 45, the pad conductor 55, the pad conductor 56, the pad conductor 46, and the through-hole conductor 63. The fifth coil conductor 25 and the sixth coil conductor 26 configure a third coil C3. The third coil C3 includes the fifth coil conductor 25 and the sixth coil conductor 26.

The multilayer common mode filter CF1 includes the first coil C1, the second coil C2, and the third coil C3 in the element body 1 (non-magnetic portion 3). The first coil C1, the second coil C2, and the third coil C3 are configured to be magnetically coupled to each other.

Each of the pad conductors 51 to 56 and through-hole conductors 61 to 63 includes a conductive material (for example, Ag or Pd). Each of the pad conductors 51 to 56 and through-hole conductors 61 to 63 is configured as a sintered body of conductive paste including a conductive material (for example, Ag powder or Pd powder). The through-hole conductors 61 to 63 are formed by sintering conductive paste filled into through-holes formed in ceramic green sheets to form the corresponding non-magnetic layers 4.

In the embodiment, the number of windings of the first coil conductor 21 is 3.75, and the number of windings of the second coil conductor 22 is 3.75. The number of windings of the first coil C1 (a total value of the number of windings of the first coil conductor 21 and the number of windings of the second coil conductor 22) is 7.5. The number of windings of the third coil conductor 23 is 3.75, and the number of windings of the fourth coil conductor 24 is 3.75. The number of windings of the second coil C2 (a total value of the number of windings of the third coil conductor 23 and the number of windings of the fourth coil conductor 24) is 7.5. The number of windings of the fifth coil conductor 25 is 3.75, and the number of windings of the sixth coil conductor 26 is 3.75. The number of windings of the third coil C3 (a total value of the number of windings of the fifth coil conductor 25 and the number of windings of the sixth coil conductor 26) is 7.5.

In the embodiment, outer diameters of the first coil conductor 21, the second coil conductor 22, the third coil conductor 23, the fourth coil conductor 24, the fifth coil conductor 25, and the sixth coil conductor 26 are equivalent to each other. Inner diameters of the first coil conductor 21, the second coil conductor 22, the third coil conductor 23, the fourth coil conductor 24, the fifth coil conductor 25, and the sixth coil conductor 26 are also equivalent to each other. In the present specification, "equivalent" does not necessarily mean only that values are exactly equal to each other. Even when a minute difference within a predetermined range or a manufacturing error or the like is included in the values, the values may be regarded as being equivalent to each other. For example, when a plurality of values are included within a range of 5% from an average value of the plurality of values, the plurality of values may be defined to be equivalent to each other.

In the embodiment, as described above, the first to sixth coil conductors 21 to 26 are disposed in the order of the first coil conductor 21, the third coil conductor 23, the fifth coil conductor 25, the second coil conductor 22, the fourth coil conductor 24, and the sixth coil conductor 26 in the height direction of the element body 1. Therefore, in the multilayer common mode filter CF1, an imbalance of an interval between the first coil C1 and the second coil C2, an interval between the second coil C2 and the third coil C3, and an interval between the first coil C1 and the third coil C3 is small as compared with a multilayer common mode filter in which the first to third coils are disposed in order of the first coil, the second coil, and the third coil in the lamination direction. As a result, in the multilayer common mode filter CF1, a difference between characteristic impedance in the first coil C1 and the second coil C2, characteristic impedance in the second coil C2 and the third coil C3, and characteristic impedance in the first coil C1 and the third coil C3 is small.

Figure 7:
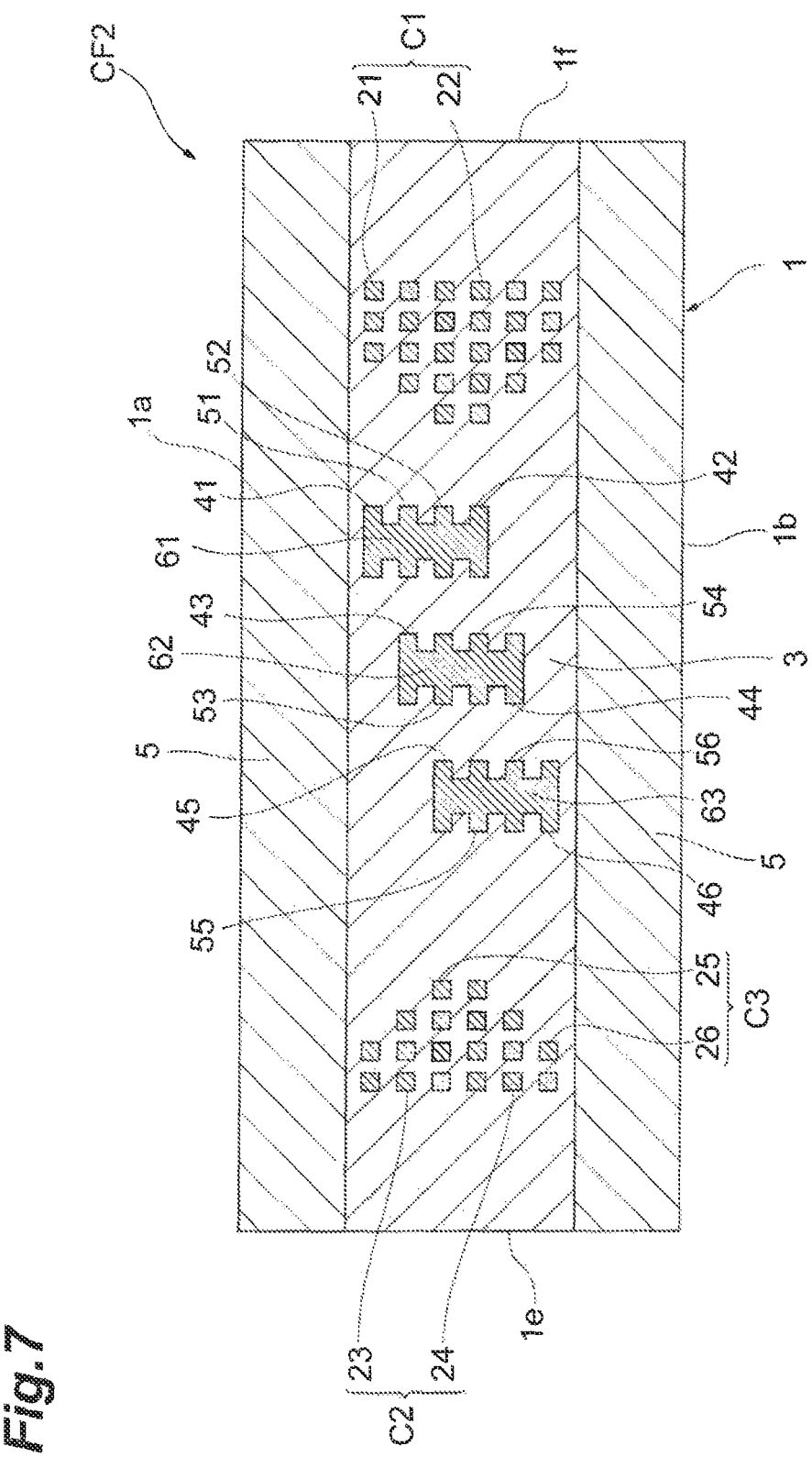
FIG. 7 is a diagram illustrating a cross-sectional configuration of an element body included in a multilayer common mode filter according to a first modification of the embodiment.
Figure 9A:
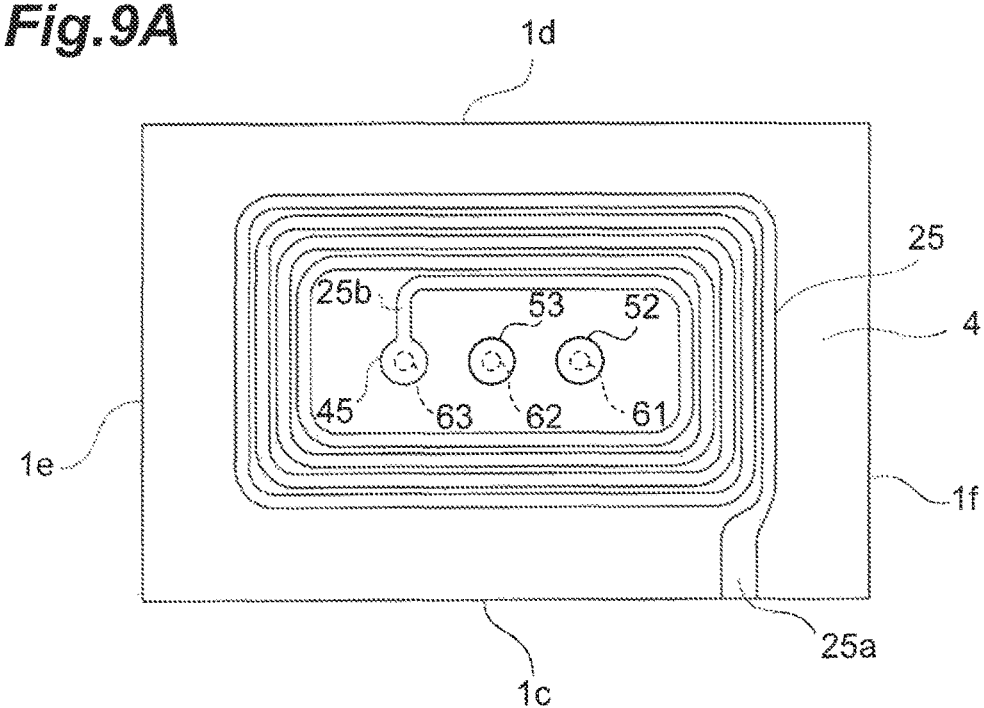
FIG. 9A is a plan view illustrating a fifth coil conductor.
Figure 9B:
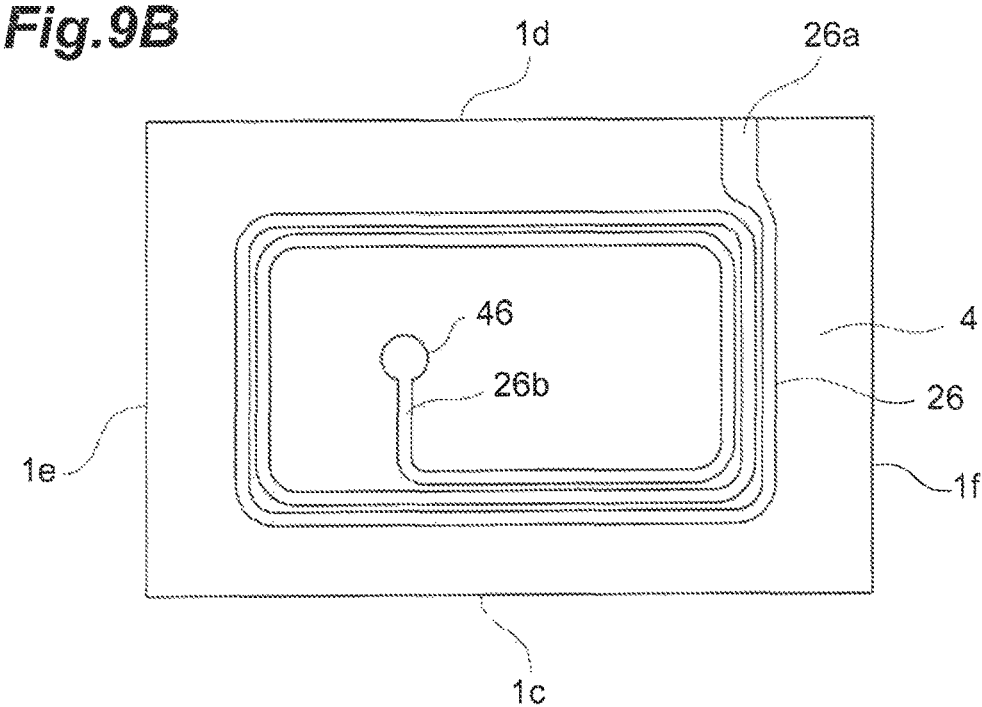
FIG. 9B is a plan view illustrating a sixth coil conductor.

Next, a configuration of a multilayer common mode filter CF2 according to a first modification of the embodiment will be described with reference to FIGS. 7, 8A, 8B, 9A, 9B, and 5. FIG. 7 is a diagram illustrating a cross-sectional configuration of an element body included in the multilayer common mode filter according to the first modification. FIG. 8A is a plan view illustrating a first coil conductor and FIG. 8B is a plan view illustrating a second coil conductor. FIG. 9A is a plan view illustrating a fifth coil conductor and FIG. 9B is a plan view illustrating a sixth coil conductor.

Similar to the multilayer common mode filter CF1 described above, the multilayer common mode filter CF2 includes an element body 1, a first terminal electrode 11, a second terminal electrode 12, a third terminal electrode 13, a fourth terminal electrode 14, a fifth terminal electrode 15, and a sixth terminal electrode 16 (refer to FIG. 1). As illustrated in FIGS. 7, 8A, 8B, 9A, and 9B, the multilayer common mode filter CF2 includes a first coil conductor 21, a second coil conductor 22, a third coil conductor 23, a fourth coil conductor 24, a fifth coil conductor 25, and a sixth coil conductor 26 in a non-magnetic portion 3.

The multilayer common mode filter CF2 is different from the multilayer common mode filter CF1 in shapes (the number of windings) of the first coil conductor 21, the second coil conductor 22, the fifth coil conductor 25, and the sixth coil conductor 26. In the multilayer common mode filter CF2, the third coil conductor 23 is the same as the third coil conductor 23 illustrated in FIG. 5A and the fourth coil conductor 24 is the same as the fourth coil conductor 24 illustrated in FIG. 5B.

In the first modification, the number of windings of the first coil conductor 21 is 2.75. The number of windings of the second coil conductor 22 is 4.75. The number of windings of a first coil C1 (a total value of the number of windings of the first coil conductor 21 and the number of windings of the second coil conductor 22) is 7.5. The number of windings of the third coil conductor 23 is 3.75, and the number of windings of the fourth coil conductor 24 is 3.75 (refer to FIG. 5). The number of windings of a second coil C2 (a total value of the number of windings of the third coil conductor 23 and the number of windings of the fourth coil conductor 24) is 7.5. The number of windings of the fifth coil conductor 25 is 4.75. The number of windings of the sixth coil conductor 26 is 2.75. The number of windings of a third coil C3 (a total value of the number of windings of the fifth coil conductor 25 and the number of windings of the sixth coil conductor 26) is 7.5.

In the first modification, outer diameters of the first coil conductor 21, the second coil conductor 22, the third coil conductor 23, the fourth coil conductor 24, the fifth coil conductor 25, and the sixth coil conductor 26 are equivalent to each other. An inner diameter of the first coil conductor 21 and an inner diameter of the sixth coil conductor 26 are equivalent to each other. An inner diameter of the second coil conductor 22 and an inner diameter of the fifth coil conductor 25 are equivalent to each other. An inner diameter of the third coil conductor 23 and an inner diameter of the fourth coil conductor 24 are equivalent to each other. The inner diameters of the first coil conductor 21 and the sixth coil conductor 26 are larger than the inner diameters of the third coil conductor 23 and the fourth coil conductor 24. The inner diameters of the second coil conductor 22 and the fifth coil conductor 25 are smaller than the inner diameters of the third coil conductor 23 and the fourth coil conductor 24.

In the first modification, the number of windings of the third coil conductor 23 and the number of windings of the fourth coil conductor 24 are smaller than the number of windings of the fifth coil conductor 25 and the number of windings of the second coil conductor 22 and are larger than the number of windings of the first coil conductor 21 and the number of windings of the sixth coil conductor 26. The number of windings of the first coil conductor 21 and the number of windings of the sixth coil conductor 26 are smaller than the number of windings of the fifth coil conductor 25 and are smaller than the number of windings of the second coil conductor 22.

With respect to the first coil C1 and the third coil C3, an interval between the first coil conductor 21 and the fifth coil conductor 25 and an interval between the second coil conductor 22 and the sixth coil conductor 26 are larger than an interval between the fifth coil conductor 25 and the second coil conductor 22. With respect to the first coil C1 and the second coil C2, an interval between the third coil conductor 23 and the second coil conductor 22 is larger than an interval between the first coil conductor 21 and the third coil conductor 23 and an interval between the second coil conductor 22 and the fourth coil conductor 24. With respect to the second coil C2 and the third coil C3, an interval between the fifth coil conductor 25 and the fourth coil conductor 24 is larger than an interval between the third coil conductor 23 and the fifth coil conductor 25 and an interval between the fourth coil conductor 24 and the sixth coil conductor 26.

When the number of windings of the first to sixth coil conductors 21 to 26 is the same, a leakage L value between the first coil C1 and the third coil C3 is larger than a leakage L value between the first coil C1 and the second coil C2 and is larger than a leakage L value between the second coil C2 and the third coil C3. In addition, a capacitance value between the first coil C1 and the third coil C3 is smaller than a capacitance value between the first coil C1 and the second coil C2 and is smaller than a capacitance value between the second coil C2 and the third coil C3. As a result, characteristic impedance in the first coil C1 and the third coil C3 may be larger than characteristic impedance in the first coil C1 and the second coil C2 and characteristic impedance in the second coil C2 and the third coil C3.

Since the first coil conductor 21 and the sixth coil conductor 26 are separated from each other in a height direction (lamination direction) of the element body 1, the first coil conductor 21 and the sixth coil conductor 26 tend not to be magnetically coupled to each other. In the multilayer common mode filter CF2, the number of windings of each of the first coil conductor 21 and the sixth coil conductor 26 that tend not to be magnetically coupled to each other is small as compared with the multilayer common mode filter CF1. Therefore, in the multilayer common mode filter CF2, the leakage L value between the first coil C1 and the third coil C3 is small as compared with the multilayer common mode filter CF1.

In the multilayer common mode filter CF2, the number of windings of the first coil conductor 21 and the number of windings of the sixth coil conductor 26 are small as compared with the multilayer common mode filter CF1. Therefore, in the multilayer common mode filter CF2, the capacitance value between the first coil C1 and the second coil C2 and the capacitance value between the second coil C2 and the third coil C3 are small as compared with the multilayer common mode filter CF1. In the multilayer common mode filter CF2, the number of windings of the second coil conductor 22 and the number of windings of the fifth coil conductor 25 are large as compared with the multilayer common mode filter CF1. Therefore, in the multilayer common mode filter CF2, the capacitance value between the first coil C1 and the third coil C3 is large as compared with the multilayer common mode filter CF1.

From the points concerning the leakage L value and the capacitance value described above, in the multilayer common mode filter CF2, the characteristic impedance in the first coil C1 and the third coil C3 is small and the characteristic impedance in the first coil C1 and the second coil C2 and the characteristic impedance in the second coil C2 and the third coil C3 are large, as compared with the multilayer common mode filter CF1.

In the multilayer common mode filter CF2, as described above, variations in the characteristic impedance in the first coil C1 and the second coil C2, the characteristic impedance in the second coil C2 and the third coil C3, and the characteristic impedance in the first coil C1 and the third coil C3 are suppressed as compared with the multilayer common mode filter CF1. In the multilayer common mode filter CF2, a difference between the characteristic impedance in the first coil C1 and the second coil C2, the characteristic impedance in the second coil C2 and the third coil C3, and the characteristic impedance in the first coil C1 and the third coil C3 is smaller.

Figure 10:
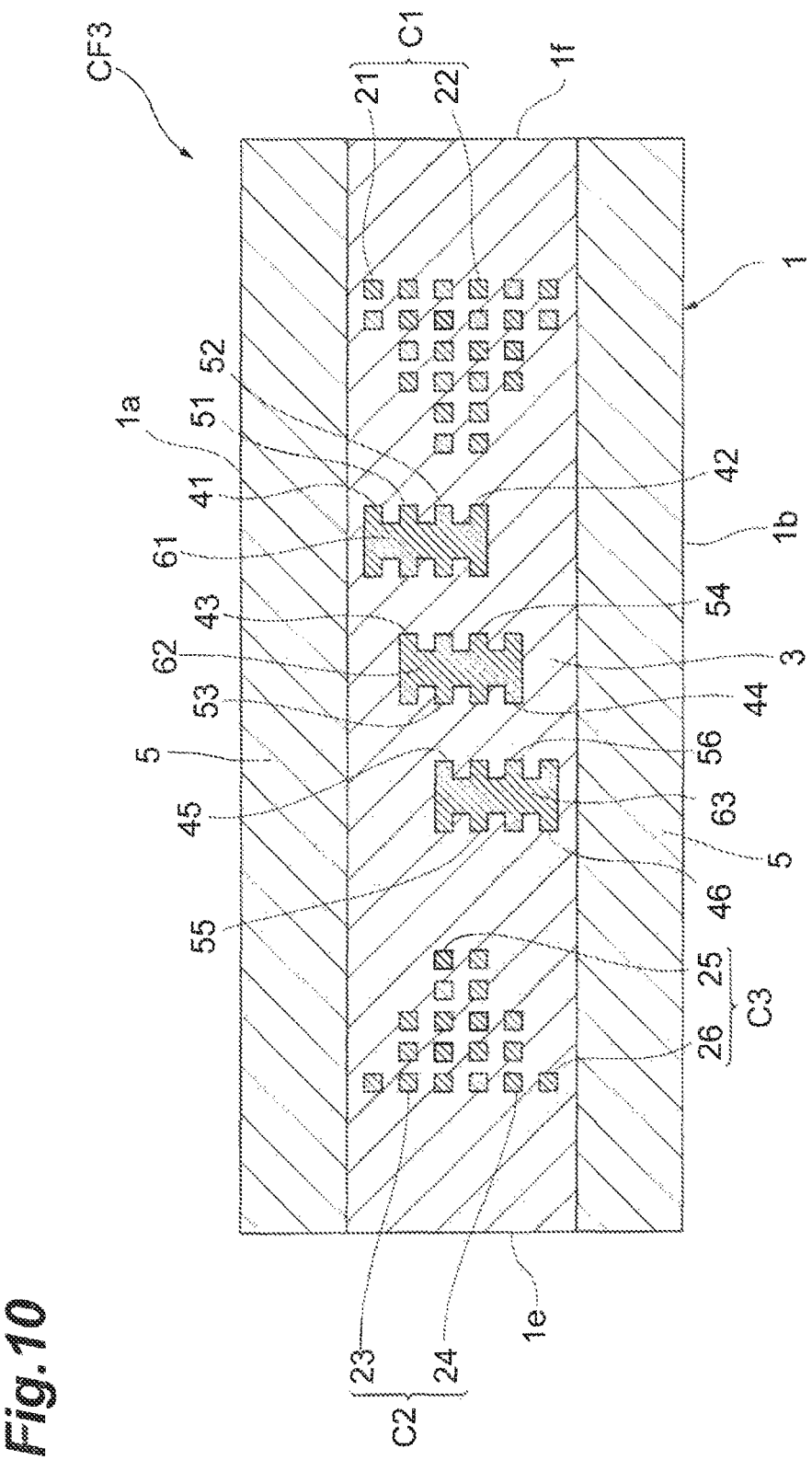
FIG. 10 is a diagram illustrating a cross-sectional configuration of an element body included in a multilayer common mode filter according to a second modification of the embodiment.
Figure 11A:
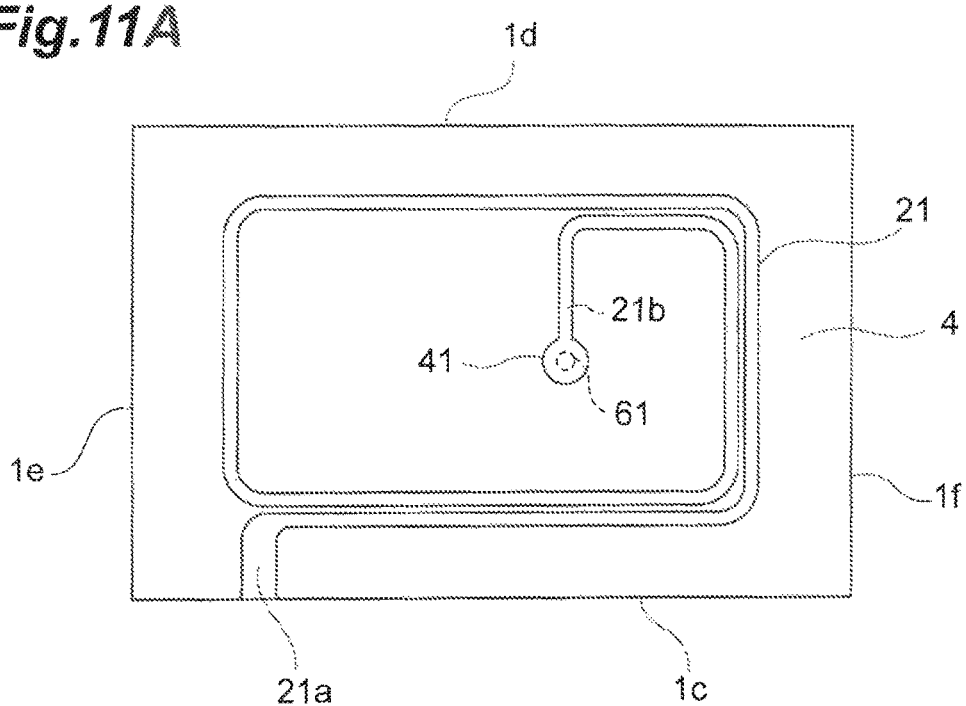
FIG. 11A is a plan view illustrating a first coil conductor.
Figure 11B:
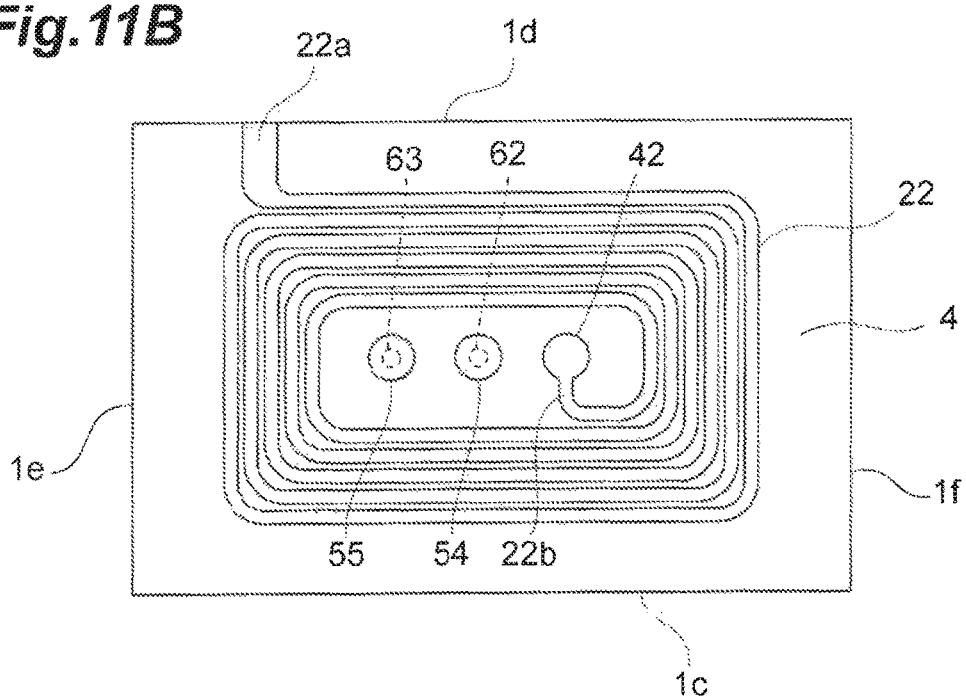
FIG. 11B is a plan view illustrating a second coil conductor.

Next, a configuration of a multilayer common mode filter CF3 according to a second modification of the embodiment will be described with reference to FIGS. 10, 11A, 11B, 12A, 12B, and 5. FIG. 10 is a diagram illustrating a cross-sectional configuration of an element body included in the multilayer common mode filter according to the second modification. FIG. 11A is a plan view illustrating a first coil conductor and FIG. 11B is a plan view illustrating a second coil conductor. FIG. 12A is a plan view illustrating a fifth coil conductor and FIG. 12B is a plan view illustrating a sixth coil conductor.

Similar to the multilayer common mode filters CF1 and CF2 described above, the multilayer common mode filter CF3 includes an element body 1, a first terminal electrode 11, a second terminal electrode 12, a third terminal electrode 13, a fourth terminal electrode 14, a fifth terminal electrode 15, and a sixth terminal electrode 16 (refer to FIG. 1). As illustrated in. FIGS. 10, 11A, 11B, 12A, and 12B, the multilayer common mode filter CF3 includes a first coil conductor 21, a second coil conductor 22, a third coil conductor 23, a fourth coil conductor 24, a fifth coil conductor 25, and a sixth coil conductor 26 in a non-magnetic portion 3.

The multilayer common mode filter CF3 is different from the multilayer common mode filters CF1 and CF2 in shapes (the number of windings) of the first coil conductor 21, the second coil conductor 22, the fifth coil conductor 25, and the sixth coil conductor 26. In the multilayer common mode filter CF3, the third coil conductor 23 is the same as the third coil conductor 23 illustrated in FIG. 5A and the fourth coil conductor 24 is the same as the fourth coil conductor 24 illustrated in FIG. 5B.

In the second modification, the number of windings of the first coil conductor 21 is 1.75. The number of windings of the second coil conductor 22 is 5.75. The number of windings of a first coil C1 (a total value of the number of windings of the first coil conductor 21 and the number of windings of the second coil conductor 22) is 7.5. The number of windings of the third coil conductor 23 is 3.75, and the number of windings of the fourth coil conductor 24 is 3.75 (refer to FIG. 5). The number of windings of a second coil C2 (a total value of the number of windings of the third coil conductor 23 and the number of windings of the fourth coil conductor 24) is 7.5. The number of windings of the fifth coil conductor 25 is 5.75. The number of windings of the sixth coil conductor 26 is 1.75. The number of windings of a third coil C3 (a total value of the number of windings of the fifth coil conductor 25 and the number of windings of the sixth coil conductor 26) is 7.5.

Similar to the first modification, even in the second modification, outer diameters of the first coil conductor 21, the second coil conductor 22, the third coil conductor 23, the fourth coil conductor 24, the fifth coil conductor 25, and the sixth coil conductor 26 are equivalent to each other. An inner diameter of the first coil conductor 21 and an inner diameter of the sixth coil conductor 26 are equivalent to each other. An inner diameter of the second coil conductor 22 and an inner diameter of the fifth coil conductor 25 are equivalent to each other. An inner diameter of the third coil conductor 23 and an inner diameter of the fourth coil conductor 24 are equivalent to each other. The inner diameters of the first coil conductor 21 and the sixth coil conductor 26 are larger than the inner diameters of the third coil conductor 23 and the fourth coil conductor 24. The inner diameters of the second coil conductor 22 and the fifth coil conductor 25 are smaller than the inner diameters of the third coil conductor 23 and the fourth coil conductor 24.

Even in the second modification, the number of windings of the third coil conductor 23 and the number of windings of the fourth coil conductor 24 are smaller than the number of windings of the fifth coil conductor 25 and the number of windings of the second coil conductor 22 and are larger than the number of windings of the first coil conductor 21 and the number of windings of the sixth coil conductor 26. The number of windings of the first coil conductor 21 and the number of windings of the sixth coil conductor 26 are smaller than the number of windings of the fifth coil conductor 25 and are smaller than the number of windings of the second coil conductor 22.

In the multilayer common mode filter CF3, the number of windings of each of the first coil conductor 21 and the sixth coil conductor 26 that tend not to be magnetically coupled to each other is small as compared with the multilayer common mode filter CF2. Therefore, in the multilayer common mode filter CF3, a leakage L value between the first coil C1 and the third coil C3 is small as compared with the multilayer common mode filter CF2.

In the multilayer common mode filter CF3, the number of windings of the first coil conductor 21 and the number of windings of the sixth coil conductor 26 are small as compared with the multilayer common mode filter CF2. Therefore, in the multilayer common mode filter CF3, a capacitance value between the first coil C1 and the second coil C2 and a capacitance value between the second coil C2 and the third coil C3 are small as compared with the multilayer common mode filter CF2. In the multilayer common mode filter CF3, the number of windings of the second coil conductor 22 and the number of windings of the fifth coil conductor 25 are large as compared with the multilayer common mode filter CF2. Therefore, in the multilayer common mode filter CF3, a capacitance value between the first coil C1 and the third coil C3 is large as compared with the multilayer common mode filter CF2.

From the points concerning the leakage L value and the capacitance value described above, in the multilayer common mode filter CF3, characteristic impedance in the first coil C1 and the third coil C3 is small and characteristic impedance in the first coil C1 and the second coil C2 and characteristic impedance in the second coil C2 and the third coil C3 are large, as compared with the multilayer common mode filter CF2.

In the multilayer common mode filter CF3, as described above, variations in the characteristic impedance in the first coil C1 and the second coil C2, the characteristic impedance in the second coil C2 and the third coil C3, and the characteristic impedance in the first coil C1 and the third coil C3 are suppressed as compared with the multilayer common mode filter CF2. In the multilayer common mode filter CF3, a difference between the characteristic impedance in the first coil C1 and the second coil C2, the characteristic impedance in the second coil C2 and the third coil C3, and the characteristic impedance in the first coil C1 and the third coil C3 is smaller.

Figure 13:
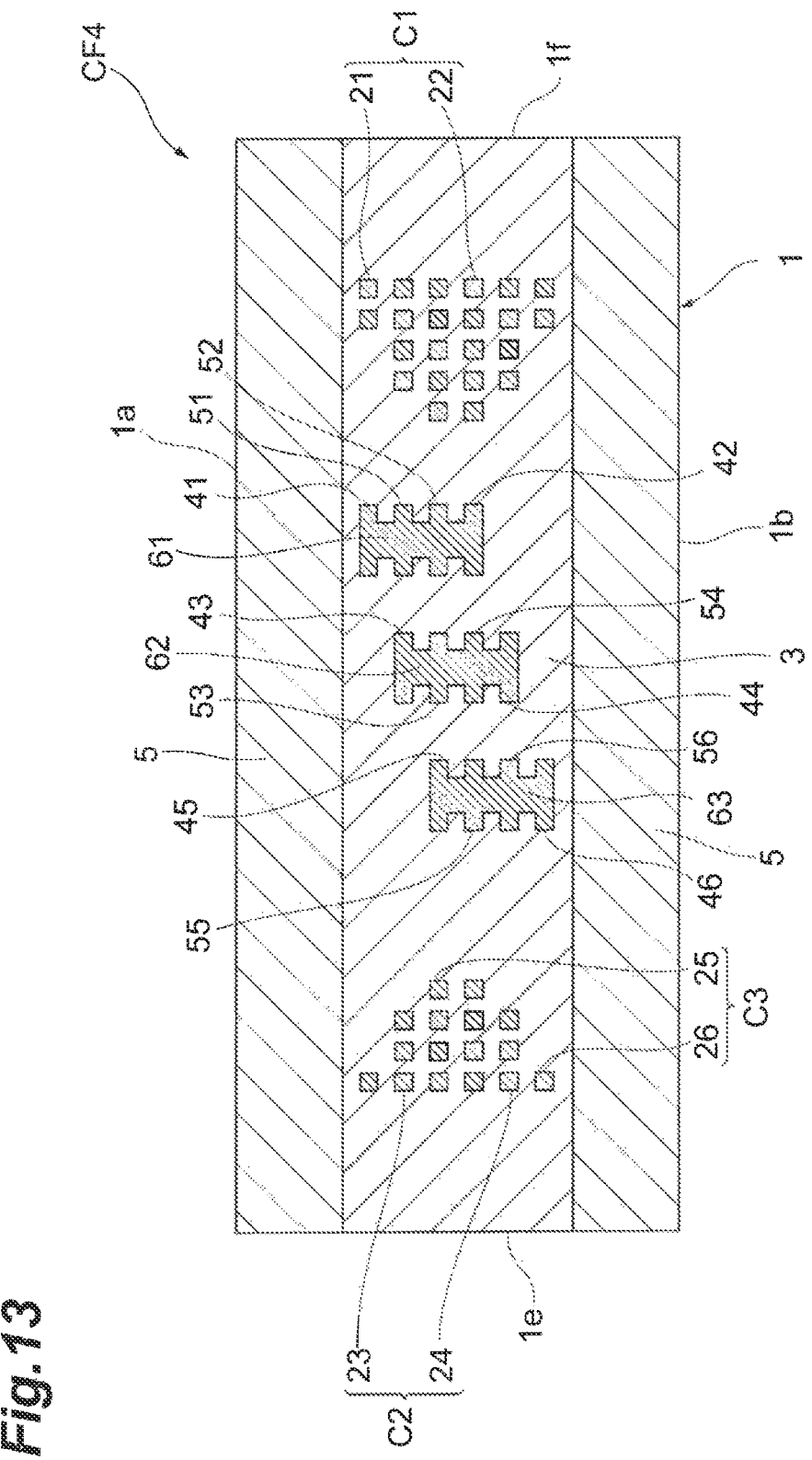
FIG. 13 is a diagram illustrating a cross-sectional configuration of an element body included in a multilayer common mode filter according to a third modification of the embodiment.
Figure 14A:
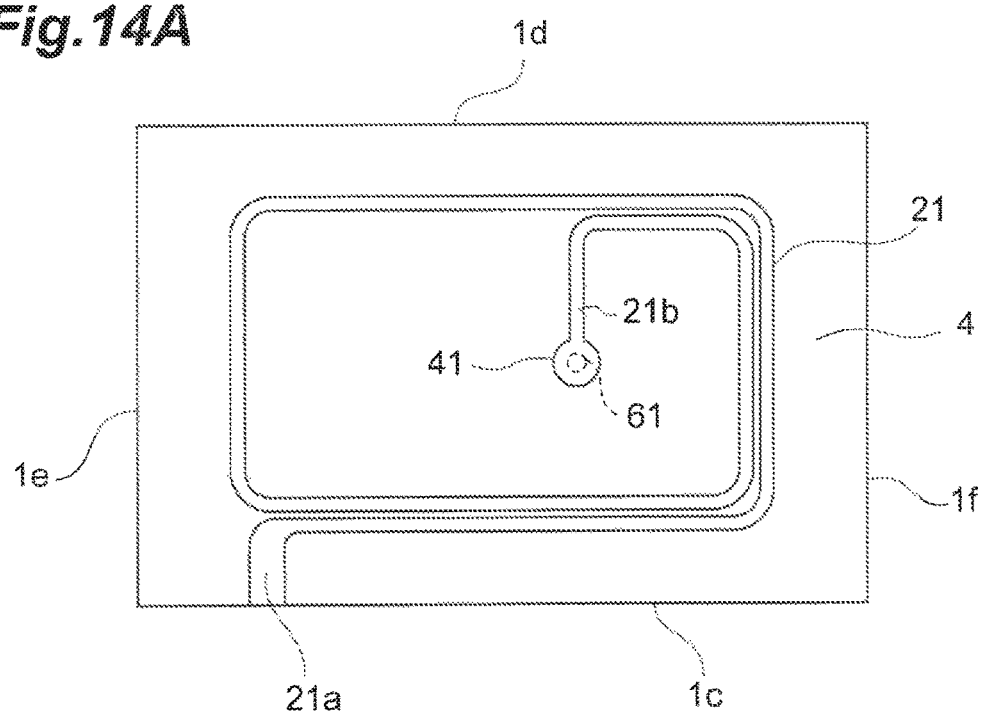
FIG. 14A is a plan view illustrating a first coil conductor.
Figure 14B:
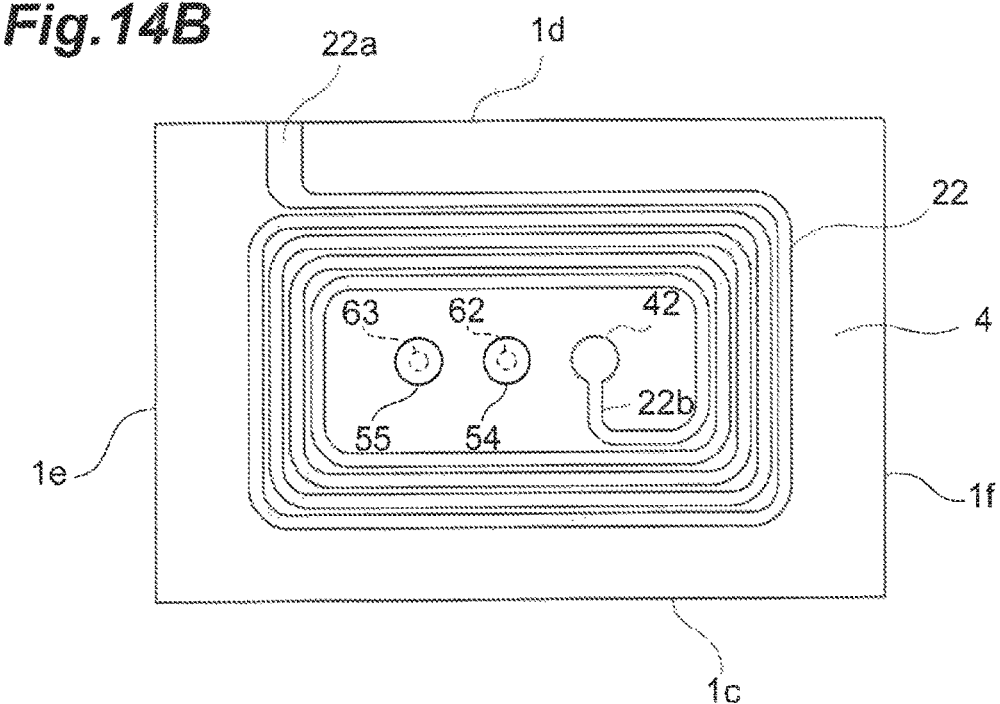
FIG. 14B is a plan view illustrating a second coil conductor.

Next, a configuration of a multilayer common mode filter CF4 according to a third modification of the embodiment will be described with reference to FIGS. 13, 14A, 14B, 15A, 15B, and 5. FIG. 13 is a diagram illustrating a cross-sectional configuration of an element body included in the multilayer common mode filter according to the third modification. FIG. 14A is a plan view illustrating a first coil conductor and FIG. 14B is a plan view illustrating a second coil conductor. FIG. 15A is a plan view illustrating a fifth coil conductor and FIG. 15B is a plan view illustrating a sixth coil conductor.

Similar to the multilayer common mode filter CF1 described above, the multilayer common mode filter CF4 includes an element body 1, a first terminal electrode 11, a second terminal electrode 12, a third terminal electrode 13, a fourth terminal electrode 14, a fifth terminal electrode 15, and a sixth terminal electrode 16 (refer to FIG. 1). As illustrated in FIGS. 13, 14A, 14B, 15A, and 15B, the multilayer common mode filter CF4 includes a first coil conductor 21, a second coil conductor 22, a third coil conductor 23, a fourth coil conductor 24, a fifth coil conductor 25, and a sixth coil conductor 26 in a non-magnetic portion 3.

The multilayer common mode filter CF4 is different from the multilayer common mode filter CF1 in shapes (the number of windings) of the first coil conductor 21, the second coil conductor 22, the fifth coil conductor 25, and the sixth coil conductor 26. In the multilayer common mode filter CF4, the third coil conductor 23 is the same as the third coil conductor 23 illustrated in FIG. 5A and the fourth coil conductor 24 is the same as the fourth coil conductor 24 illustrated in FIG. 5B.

In the third modification, the number of windings of the first coil conductor 21 is 1.75. The number of windings of the second coil conductor 22 is 4.75. The number of windings of a first coil C1 (a total value of the number of windings of the first coil conductor 21 and the number of windings of the second coil conductor 22) is 6.5. The number of windings of the third coil conductor 23 is 3.75, and the number of windings of the fourth coil conductor 24 is 3.75 (refer to FIG. 5). The number of windings of a second coil C2 (a total value of the number of windings of the third coil conductor 23 and the number of windings of the fourth coil conductor 24) is 7.5. The number of windings of the fifth coil conductor 25 is 4.75. The number of windings of the sixth coil conductor 26 is 1.75. The number of windings of a third coil C3 (a total value of the number of windings of the fifth coil conductor 25 and the number of windings of the sixth coil conductor 26) is 6.5.

Similar to the first and second modifications, even in the third modification, outer diameters of the first coil conductor 21, the second coil conductor 22, the third coil conductor 23, the fourth coil conductor 24, the fifth coil conductor 25, and the sixth coil conductor 26 are equivalent to each other. An inner diameter of the first coil conductor 21 and an inner diameter of the sixth coil conductor 26 are equivalent to each other. An inner diameter of the second coil conductor 22 and an inner diameter of the fifth coil conductor 25 are equivalent to each other. An inner diameter of the third coil conductor 23 and an inner diameter of the fourth coil conductor 24 are equivalent to each other. The inner diameters of the first coil conductor 21 and the sixth coil conductor 26 are larger than the inner diameters of the third coil conductor 23 and the fourth coil conductor 24. The inner diameters of the second coil conductor 22 and the fifth coil conductor 25 are smaller than the inner diameters of the third coil conductor 23 and the fourth coil conductor 24.

Even in the third modification, the number of windings of the third coil conductor 23 and the number of windings of the fourth coil conductor 24 are smaller than the number of windings of the fifth coil conductor 25 and the number of windings of the second coil conductor 22 and are larger than the number of windings of the first coil conductor 21 and the number of windings of the sixth coil conductor 26. The number of windings of the first coil conductor 21 and the number of windings of the sixth coil conductor 26 are smaller than the number of windings of the fifth coil conductor 25 and are smaller than the number of windings of the second coil conductor 22.

The number of windings of the first coil C1 and the number of windings of the third coil C3 are smaller than the number of windings of the second coil C2. Therefore, in the multilayer common mode filter CF4, an inductance value of the first coil C1 and an inductance value of the third coil C3 are small as compared with the multilayer common mode filter CF1. In the multilayer common mode filter CF4, the number of windings of each of the first coil conductor 21 and the sixth coil conductor 26 that tend not to be magnetically coupled to each other is small as compared with the multilayer common mode filter CF1. Therefore, in the multilayer common mode filter CF4, a leakage L value between the first coil C1 and the third coil C3 is small as compared with the multilayer common mode filter CF1.

When the number of windings of the coil is small, an area of coil conductors configuring the coil is small and a capacitance value is small, as compared with when the number of windings of the coil is large. Therefore, when the number of windings of the coil is small, characteristic impedance may be large as compared with when the number of windings of the coil is large.

In the third modification, as compared with the multilayer common mode filter CF1, the number of windings of the second coil conductor 22 and the number of windings of the fifth coil conductor 25 are large. Therefore, in the third modification, a capacitance value between the first coil C1 and the third coil C3 is large as compared with the multilayer common mode filter CF1.

In the third modification, as described above, characteristic impedance in the first coil C1 and the third coil C3 is further suppressed from increasing. As a result, variations in the characteristic impedance in the first coil C1 and the second coil C2, the characteristic impedance in the second coil C2 and the third coil C3, and the characteristic impedance in the first coil C1 and the third coil C3 are further suppressed. In the multilayer common mode filter CF4, a difference between the characteristic impedance in the first coil C1 and the second coil C2, the characteristic impedance in the second coil C2 and the third coil C3, and the characteristic impedance in the first coil C1 and the third coil C3 is extremely small.

In the third modification, the number of windings of each of the second coil conductor 22 and the fifth coil conductor 25 is small as compared with the second modification. In the third and second modifications, the outer diameters of the second coil conductor 22 and the fifth coil conductor 25 are equivalent to each other. Therefore, in the third modification, the inner diameter of the second coil conductor 22 is large as compared with the second modification. That is, an internal area of the second coil conductor 22 is large. As a result, formation of three pad conductors 42, 54, and 55 located inside the second coil conductor 22 is easy. Likewise, in the third modification, the inner diameter of the fifth coil conductor 25 is large as compared with the second modification. That is, an internal area of the fifth coil conductor 25 is large. As a result, formation of three pad conductors 45, 52, and 53 located inside the fifth coil conductor 25 is easy.

Figure 16:
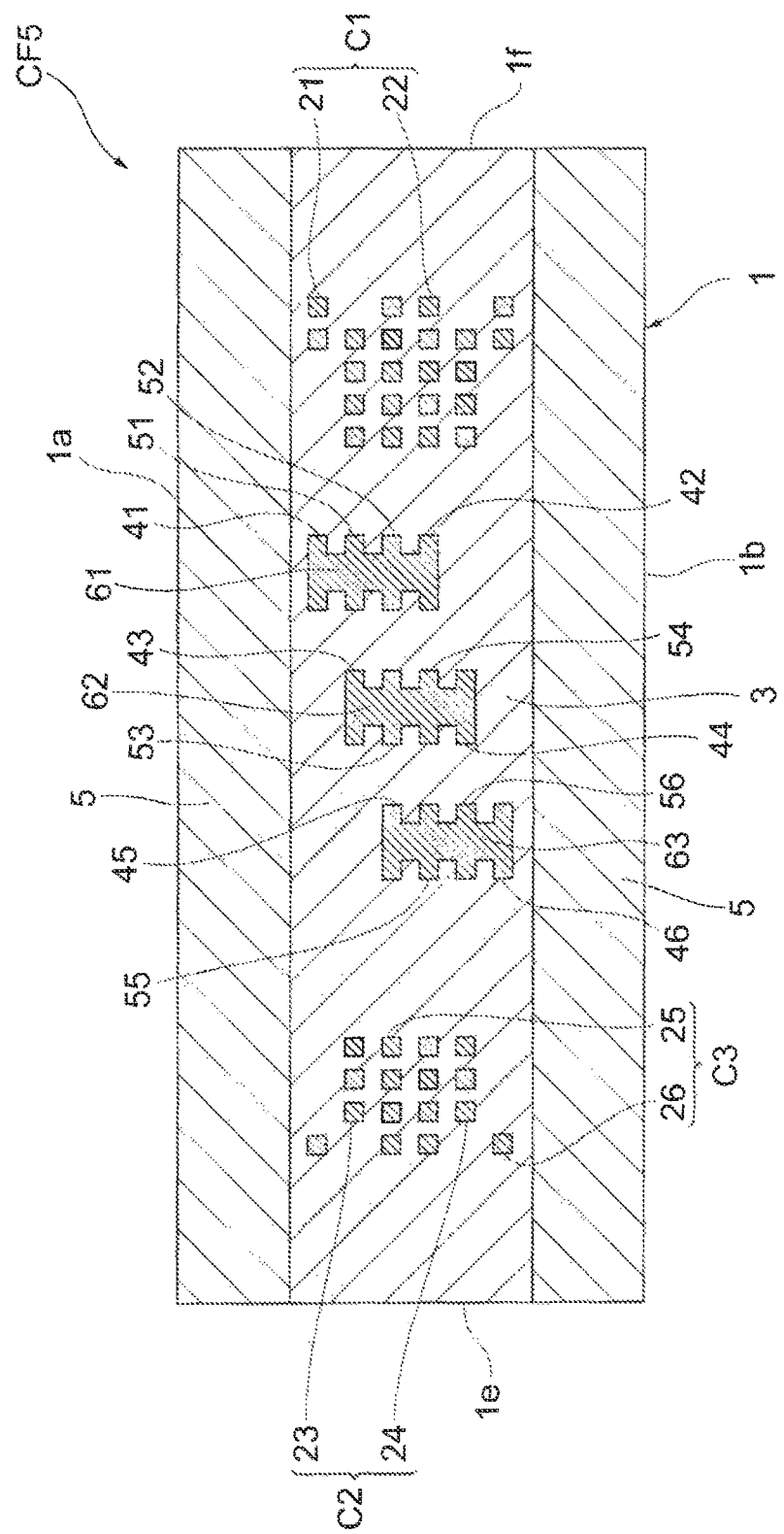
FIG. 16 is a diagram illustrating a cross-sectional configuration of an element body included in a multilayer common mode filter according to a fourth modification of the embodiment.
Figure 17A:
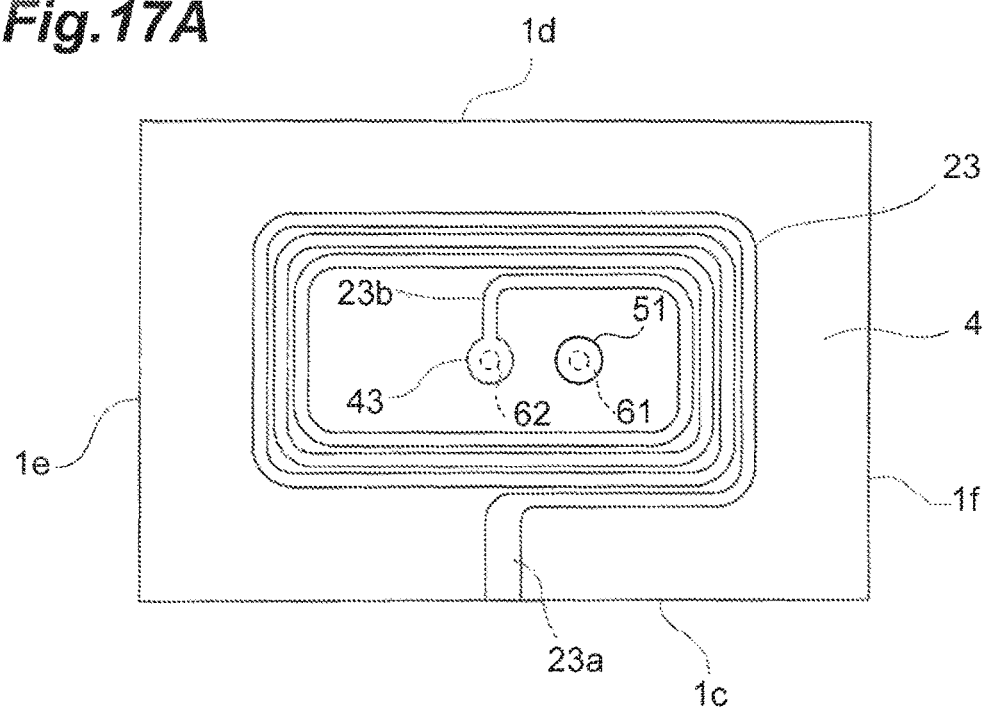
FIG. 17A is a plan view illustrating a third coil conductor.
Figure 17B:
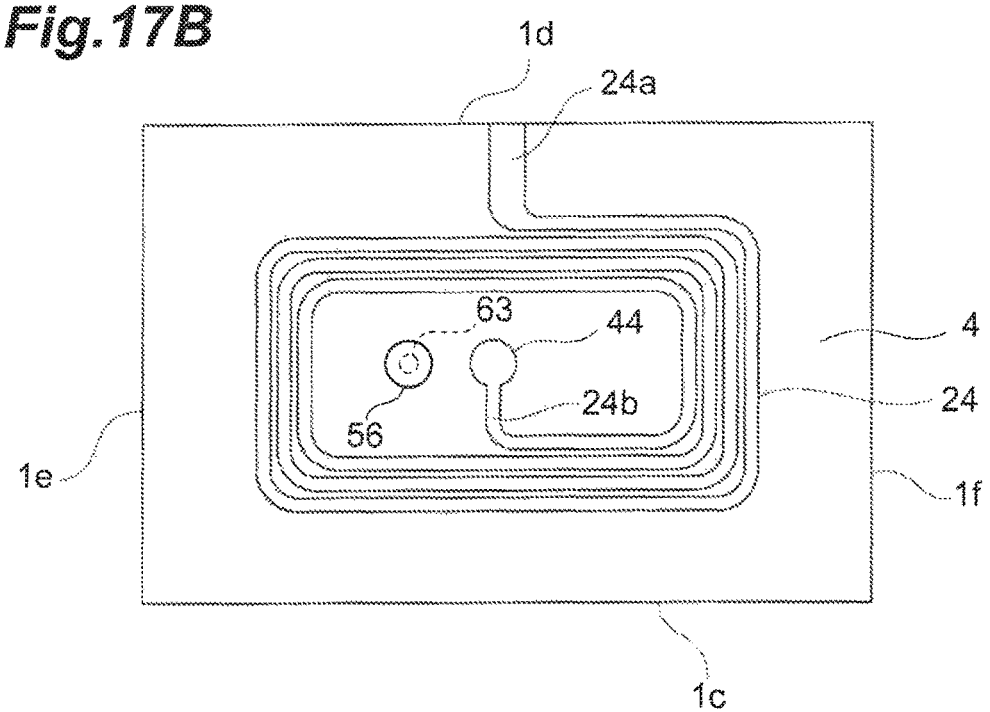
FIG. 17B is a plan view illustrating a fourth coil conductor.

Next, a configuration of a multilayer common mode filter CF5 according to a fourth modification of this embodiment will be described with reference to FIGS. 16, 17A, 17B, 14A, 14B, 15A, and 15B. FIG. 16 is a diagram illustrating a cross-sectional configuration of an element body included in the multilayer common mode filter according to the fourth modification. FIG. 17A is a plan view illustrating a third coil conductor and FIG. 17B is a plan view illustrating a fourth coil conductor.

Similar to the multilayer common mode filter CF1 described above, the multilayer common mode filter CF5 includes an element body 1, a first terminal electrode 11, a second terminal electrode 12, a third terminal electrode 13, a fourth terminal electrode 14, a fifth terminal electrode 15, and a sixth terminal electrode 16 (refer to FIG. 1). As illustrated in FIGS. 16, 17A, and 17B, the multilayer common mode filter CF5 includes a first coil conductor 21, a second coil conductor 22, a third coil conductor 23, a fourth coil conductor 24, a fifth coil conductor 25, and a sixth coil conductor 26 in a non-magnetic portion 3.

The multilayer common mode filter CF5 is the same as the multilayer common mode filter CF4 in shapes (the number of windings) of the first coil conductor 21, the second coil conductor 22, the fifth coil conductor 25, and the sixth coil conductor 26. In the multilayer common mode filter CF5, the first coil conductor 21 is the same as the first coil conductor 21 illustrated in FIG. 14A and the second coil conductor 22 is the same as the second coil conductor 22 illustrated in FIG. 14B. The fifth coil conductor 25 is the same as the fifth coil conductor 25 illustrated in FIG. 15A and the sixth coil conductor 26 is the same as the sixth coil conductor 26 illustrated in FIG. 15B.

Even in the fourth modification, the number of windings of the first coil conductor 21 is 1.75. The number of windings of the second coil conductor 22 is 4.75 (refer to FIG. 14). The number of windings of a first coil C1 (a total value of the number of windings of the first coil conductor 21 and the number of windings of the second coil conductor 22) is 6.5. The number of windings of the third coil conductor 23 is 3.75, and the number of windings of the fourth coil conductor 24 is 3.75 (refer to FIG. 17). The number of windings of a second coil C2 (a total value of the number of windings of the third coil conductor 23 and the number of windings of the fourth coil conductor 24) is 7.5. The number of windings of the fifth coil conductor 25 is 4.75 and the number of windings of the sixth coil conductor 26 is 1.75 (refer to FIG. 15). The number of windings of a third coil C3 (a total value of the number of windings of the fifth coil conductor 25 and the number of windings of the sixth coil conductor 26) is 6.5.

In the fourth modification, outer diameters of the third coil conductor 23 and the fourth coil conductor 24 are smaller than outer diameters of the first coil conductor 21, the second coil conductor 22, the fifth coil conductor 25, and the sixth coil conductor 26. An inner diameter of the first coil conductor 21 and an inner diameter of the sixth coil conductor 26 are equivalent to each other. Inner diameters of the second coil conductor 22, the third coil conductor 23, the fourth coil conductor 24, and the fifth coil conductor 25 are equivalent to each other. The inner diameters of the first coil conductor 21 and the sixth coil conductor 26 are larger than the inner diameters of the second coil conductor 22, the third coil conductor 23, the fourth coil conductor 24, and the fifth coil conductor 25.

Similar to the multilayer common mode filter CF4, in the multilayer common mode filter CF5, a difference between characteristic impedance in the first coil C1 and the second coil C2, characteristic impedance in the second coil C2 and the third coil C3, and characteristic impedance in the first coil C1 and the third coil C3 is extremely small. Even in the multilayer common mode filter CF5, formation of three pad conductors 42, 54, and 55 located inside the second coil conductor 22 is easy and formation of three pad conductors 45, 52, and 53 located inside the fifth coil conductor 25 is easy.

In the multilayer common mode filter CF5, as described above, the outer diameters of the third coil conductor 23 and the fourth coil conductor 24 are smaller than the outer diameters of the first coil conductor 21, the second coil conductor 22, the fifth coil conductor 25, and the sixth coil conductor 26. Therefore, in the multilayer common mode filter CF5, the inner diameters of the third coil conductor and the fourth coil conductor can be decreased as compared with the multilayer common mode filter CF4. As a result, in the multilayer common mode filter CF5, a difference between an inductance value of each of the first coil C1 and the third coil C3 and an inductance value of the second coil C2 is small as compared with the multilayer common mode filter CF4.

Although the embodiment and modifications of the present invention have been described above, the present invention is not necessarily limited to the embodiment and modifications, and the embodiment can be variously changed without departing from the scope of the invention.

The number of windings of the first to sixth coil conductors 21 to 26 is not limited to the values described above.

The number of windings of the second coil conductor 22, the third coil conductor 23, the fourth coil conductor 24, and the fifth coil conductor 25 may be the same and the number of windings of the first coil conductor 21 and the sixth coil conductor 26 may be smaller than the number of windings of the second coil conductor 22, the third coil conductor 23, the fourth coil conductor 24, and the fifth coil conductor 25.

What is claimed is:

1. A multilayer common mode filter comprising:
an element body including a pair of principal surfaces opposing each other in a first direction; and
a first coil, a second coil and a third coil disposed in the element body and configured to be magnetically coupled to each other,
wherein:
the first coil includes a first coil conductor and a second coil conductor having spiral shapes and is configured by electrically connecting the first coil conductor and the second coil conductor;
the second coil includes a third coil conductor and a fourth coil conductor having spiral shapes and is configured by electrically connecting the third coil conductor and the fourth coil conductor;
the third coil includes a fifth coil conductor and a sixth coil conductor having spiral shapes and is configured by electrically connecting the fifth coil conductor and the sixth coil conductor;
the first to sixth coil conductors are disposed in order of the first coil conductor, the third coil conductor, the fifth coil conductor, the second coil conductor, the fourth coil conductor, and the sixth coil conductor in the first direction; and
the number of windings of the first coil conductor and the number of windings of the sixth coil conductor are smaller than both the number of windings of the fifth coil conductor and the number of windings of the second coil conductor.

2. The multilayer common mode filter according to claim 1, wherein:
a total value of the number of windings of the first coil conductor and the number of windings of the second coil conductor is smaller than a total value of the number of windings of the third coil conductor and the number of windings of the fourth coil conductor; and
a total value of the number of windings of the fifth coil conductor and the number of windings of the sixth coil conductor is smaller than the total value of the number of windings of the third coil conductor and the number of windings of the fourth coil conductor.

3. The multilayer common mode filter according to claim 2, wherein
outer diameters of the third coil conductor and the fourth coil conductor are smaller than outer diameters of the first coil conductor, the second coil conductor, the fifth coil conductor, and the sixth coil conductor.

4. A multilayer common mode filter comprising:
an element body including a pair of principal surfaces opposing each other in a first direction; and
a first coil, a second coil and a third coil disposed in the element body and configured to be magnetically coupled to each other, wherein:

the first coil includes a first coil conductor and a second coil conductor having spiral shapes and is configured by electrically connecting the first coil conductor and the second coil conductor;

the second coil includes a third coil conductor and a fourth coil conductor having spiral shapes and is configured by electrically connecting the third coil conductor and the fourth coil conductor;

the third coil includes a fifth coil conductor and a sixth coil conductor having spiral shapes and is configured by electrically connecting the fifth coil conductor and the sixth coil conductor;

the first to sixth coil conductors are disposed in order of the first coil conductor, the third coil conductor, the fifth coil conductor, the second coil conductor, the fourth coil conductor, and the sixth coil conductor in the first direction;

a total value of the number of windings of the first coil conductor and the number of windings of the second coil conductor is smaller than a total value of the number of windings of the third coil conductor and the number of windings of the fourth coil conductor; and a total value of the number of windings of the fifth coil conductor and the number of windings of the sixth coil conductor is smaller than the total value of the number of windings of the third coil conductor and the number of windings of the fourth coil conductor.

5. The multilayer common mode filter according to claim 4, wherein outer diameters of the third coil conductor and the fourth coil conductor are smaller than each of outer diameters of the first coil conductor, the second coil conductor, the fifth coil conductor, and the sixth coil conductor.

* * * * *